(12) United States Patent
Futamura et al.

(10) Patent No.: US 11,967,577 B2
(45) Date of Patent: Apr. 23, 2024

(54) SEMICONDUCTOR DEVICE AND METHOD FOR MANUFACTURING THE SAME

(71) Applicant: ROHM Co., LTD., Kyoto (JP)

(72) Inventors: Yosui Futamura, Kyoto (JP); Yuto Nishiyama, Kyoto (JP); Masahiko Nakamura, Kyoto (JP)

(73) Assignee: ROHM Co., LTD., Kyoto (JP)

( * ) Notice: Subject to any disclaimer, the term of this patent is extended or adjusted under 35 U.S.C. 154(b) by 298 days.

(21) Appl. No.: 17/498,843

(22) Filed: Oct. 12, 2021

(65) Prior Publication Data

US 2022/0115347 A1    Apr. 14, 2022

(30) Foreign Application Priority Data

Oct. 13, 2020  (JP) ................. 2020-172419

(51) Int. Cl.
  *H01L 23/00* (2006.01)
  *H01L 23/495* (2006.01)
  *H01L 23/31* (2006.01)

(52) U.S. Cl.
  CPC .......... *H01L 24/13* (2013.01); *H01L 23/4951* (2013.01); *H01L 24/11* (2013.01); *H01L 24/14* (2013.01); *H01L 24/16* (2013.01); *H01L 23/3107* (2013.01); *H01L 24/81* (2013.01); *H01L 2224/113* (2013.01); *H01L 2224/11825* (2013.01); *H01L 2224/13019* (2013.01); *H01L 2224/13147* (2013.01); *H01L 2224/13562* (2013.01); *H01L 2224/13564* (2013.01); *H01L 2224/1357* (2013.01); *H01L 2224/13582* (2013.01); *H01L 2224/13664* (2013.01); *H01L 2224/1379* (2013.01); *H01L 2224/13839* (2013.01); *H01L 2224/1416* (2013.01); *H01L 2224/16245* (2013.01); *H01L 2224/8184* (2013.01)

(58) Field of Classification Search
  None
  See application file for complete search history.

(56) References Cited

U.S. PATENT DOCUMENTS 9,190,348 B2 * 11/2015 Chen ............... H01L 23/562
2013/0077272 A1 * 3/2013 Lin .................. H01L 22/32
                                               174/257
2016/0148888 A1 * 5/2016 Ryu ................ H01L 24/17
                                               257/737

FOREIGN PATENT DOCUMENTS

JP     2018085522     5/2018

* cited by examiner

*Primary Examiner* — Hung K Vu
(74) *Attorney, Agent, or Firm* — CHIP LAW GROUP

(57) ABSTRACT

Disclosed herein is a semiconductor device including a conductive member that has a main surface facing in a thickness direction, a semiconductor element that has a plurality of pads facing the main surface, a plurality of electrodes that are individually formed with respect to the plurality of pads and protrude from the plurality of pads toward the main surface, and a bonding layer for electrically bonding the main surface to the plurality of electrodes. The bonding layer includes a first region having conductivity and a second region having electrical insulation. The first region includes a metal portion. At least a part of the second region includes a resin portion.

15 Claims, 16 Drawing Sheets

SEMICONDUCTOR DEVICE AND METHOD FOR MANUFACTURING THE SAME

CROSS REFERENCE TO RELATED APPLICATIONS

This application claims priority benefit of Japanese Patent Application No. JP 2020-172419 filed in the Japan Patent Office on Oct. 13, 2020. Each of the above-referenced applications is hereby incorporated herein by reference in its entirety.

BACKGROUND

The present disclosure relates to a semiconductor device including a semiconductor element subjected to flip-chip mounting and a method for manufacturing the same.

A semiconductor device in which a semiconductor element is bonded to a conductive member (lead frame, for example) by flip mounting has been widely known. JP 2018-85522A (hereinafter, referred to as Patent Document 1) discloses an example of such a semiconductor device. In the semiconductor device, a plurality of electrodes of a semiconductor element (semiconductor chip in Patent Document 1) are bonded to a conductive member (lead wiring in Patent Document 1) by a bonding layer (conductor bump in Patent Document 1). The plurality of electrodes of the semiconductor element face the conductive member.

The bonding layer of the semiconductor device disclosed in Patent Document 1 is made of solder. Therefore, in a case where the number of a plurality of electrodes is increased according to a circuit configured in the semiconductor element, when the plurality of electrodes are bonded to the conductive member via the bonding layer, there is fear that the plurality of electrodes may be short-circuited due to the molten bonding layer. Further, thermal stress affects the bonding layer because of the influence of heat generated from the semiconductor element. In a case where the bonding layer is solder, cracks due to the thermal stress are likely to occur. Therefore, it may be required to take measures against these.

SUMMARY

In view of the above circumstances, it is desirable to provide a semiconductor device capable of suppressing the occurrence of cracks on the bonding layer while preventing short circuits of a plurality of electrodes, and a manufacturing method thereof.

The semiconductor device provided by the first aspect of the present disclosure is provided with a conductive member that has a main surface facing in a thickness direction, a semiconductor element that has a plurality of pads facing the main surface, a plurality of electrodes that are individually formed with respect to the plurality of pads and protrude from the plurality of pads toward the main surface, and a bonding layer for electrically bonding the main surface to the plurality of electrodes. The bonding layer includes a first region having conductivity and a second region having electrical insulation. The first region includes a metal portion. At least a part of the second region includes a resin portion.

The method for manufacturing a semiconductor device provided by the second aspect of the present disclosure is provided with a step of individually forming a plurality of electrodes with respect to a plurality of pads, on a semiconductor element that has the plurality of pads provided on one side in a thickness direction, a step of applying a bonding material to the plurality of electrodes, and a step of electrically bonding the plurality of electrodes to a main surface of a conductive member that has the main surface facing in the thickness direction such that the plurality of electrodes face the main surface. The bonding material is made of a material containing a metal particle and a resin. In the step of bonding the plurality of electrodes to the main surface, the plurality of electrodes are electrically bonded to the main surface by firing the bonding material under atmospheric pressure after the bonding material is brought into contact with the main surface.

According to the semiconductor device and the manufacturing method thereof according to an embodiment of the present disclosure, the occurrence of cracks on the bonding layer can be suppressed while short circuits of a plurality of electrodes are prevented.

Other features and advantages of the present disclosure will become more apparent with the detailed description given below based on the accompanying drawings.

DETAILED DESCRIPTION OF THE PREFERRED EMBODIMENTS

Modes for carrying out the present disclosure will be described with reference to the accompanying drawings. Each of the accompanying drawings is schematically drawn. Each of the accompanying drawings may contain omitted and exaggerated parts.

First Embodiment

Figure 1:
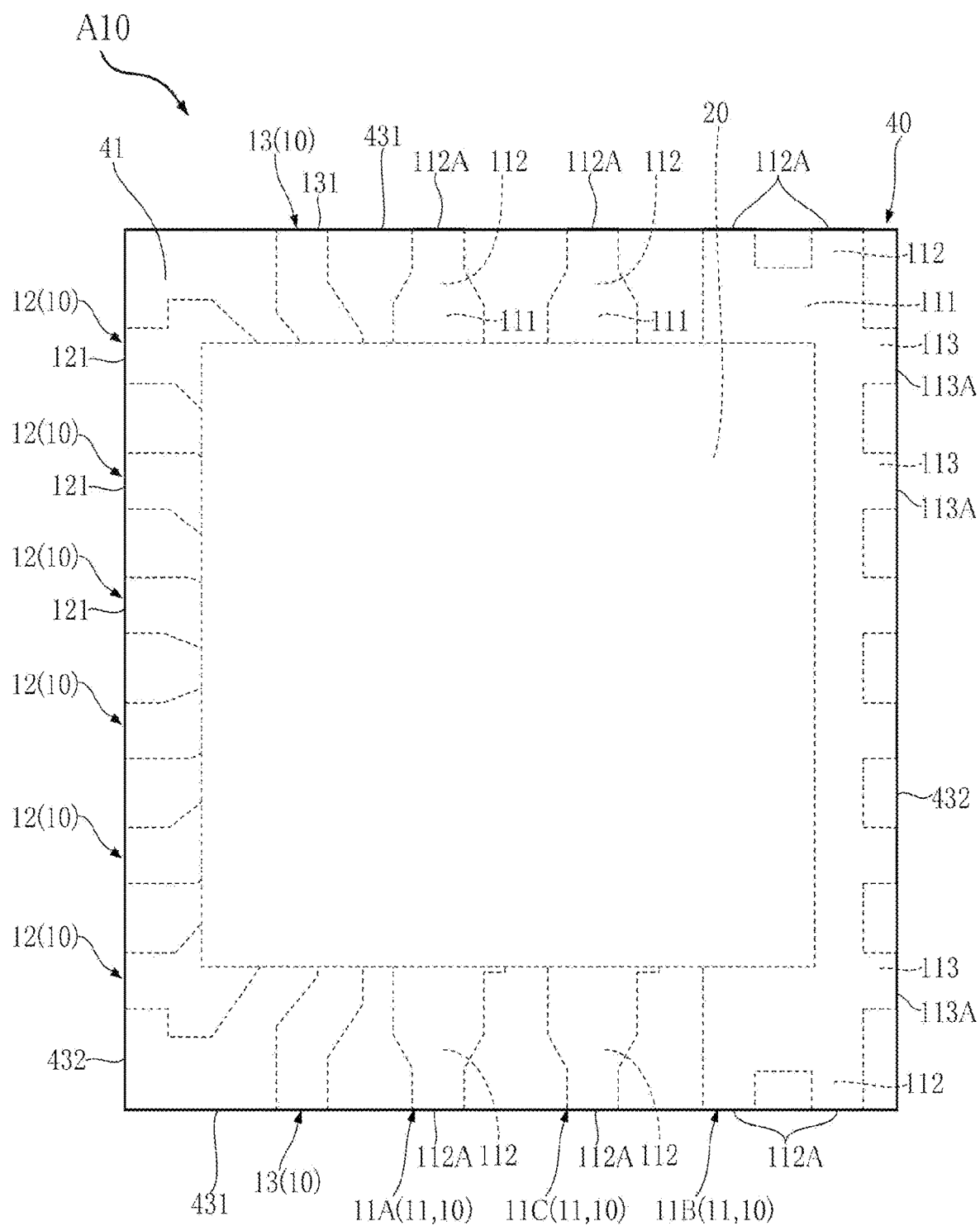
FIG. 1 is a plan view of a semiconductor device according to a first embodiment of the present disclosure.
Figure 1:
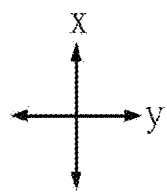

A semiconductor device A10 according to a first embodiment of the present disclosure will be described with reference to FIGS. 1 to 16. The semiconductor device A10 includes a conductive member 10, a semiconductor element 20, a plurality of electrodes 31, a bonding layer 32, and a sealing resin 40. As illustrated in FIG. 1, the package type of the semiconductor device A10 is a quad flat non-lead package (QFN). The semiconductor element 20 is flip-chip type large-scale integration (LSI). The semiconductor element 20 includes a switching circuit 212A and a control circuit 212B (respective details will be described later) therein. In the semiconductor device A10, direct current (DC) power (voltage) is converted into alternate current (AC) power (voltage) by the switching circuit 212A. The semiconductor device A10 is used as one element constituting the circuit of a DC/DC converter, for example. Here, in FIG. 2, the view is seen through the sealing resin 40 for convenience of understanding. In FIG. 3, the view is further seen through the semiconductor element 20 of FIG. 2 for convenience of understanding. In these figures, the semiconductor element 20 and the sealing resin 40 seen through are each illustrated by an imaginary line (alternate long and two short dashes line).

Figure 2:
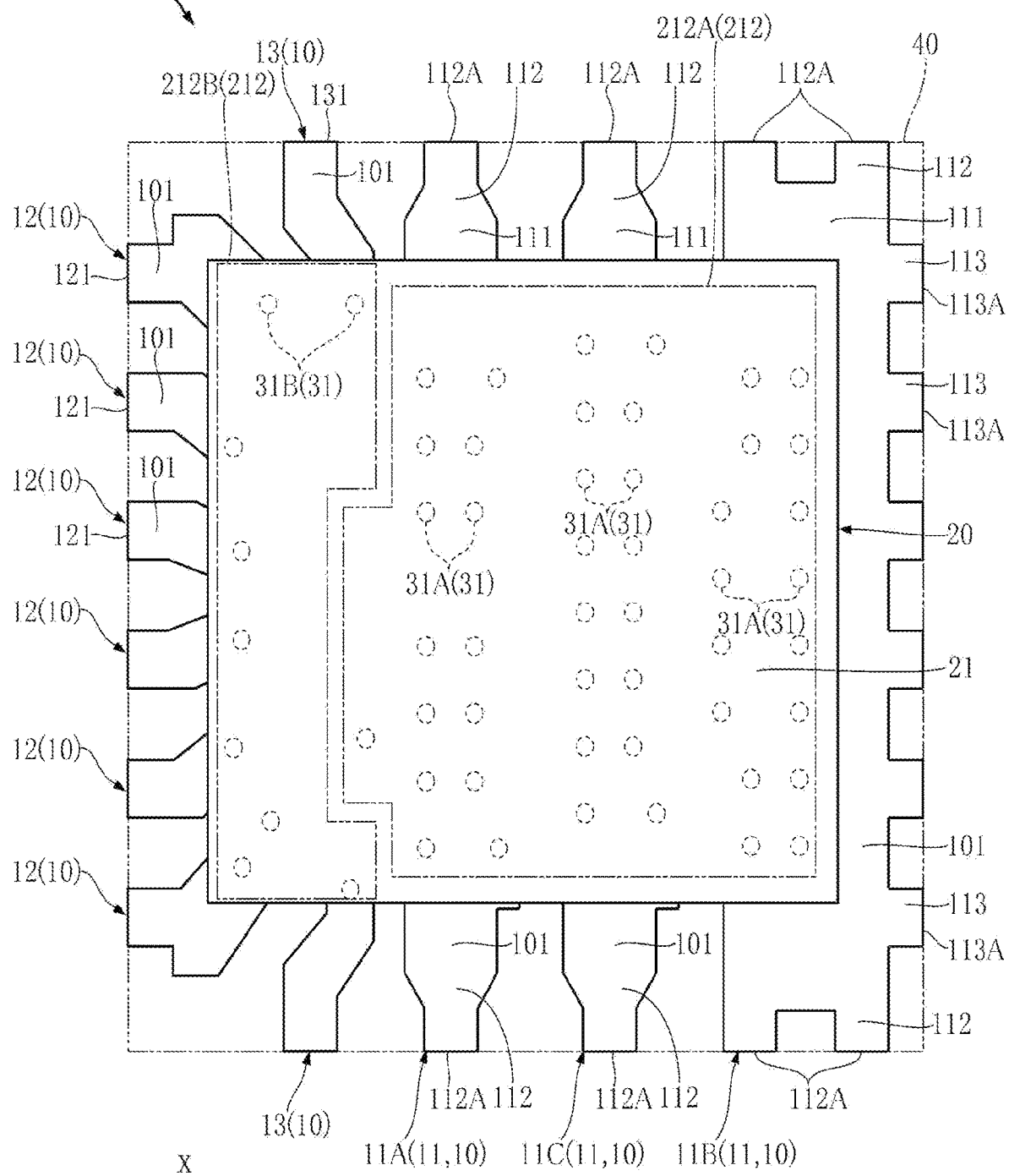
FIG. 2 is a plan view of the semiconductor device corresponding to FIG. 1, which is seen through a sealing resin.
Figure 3:
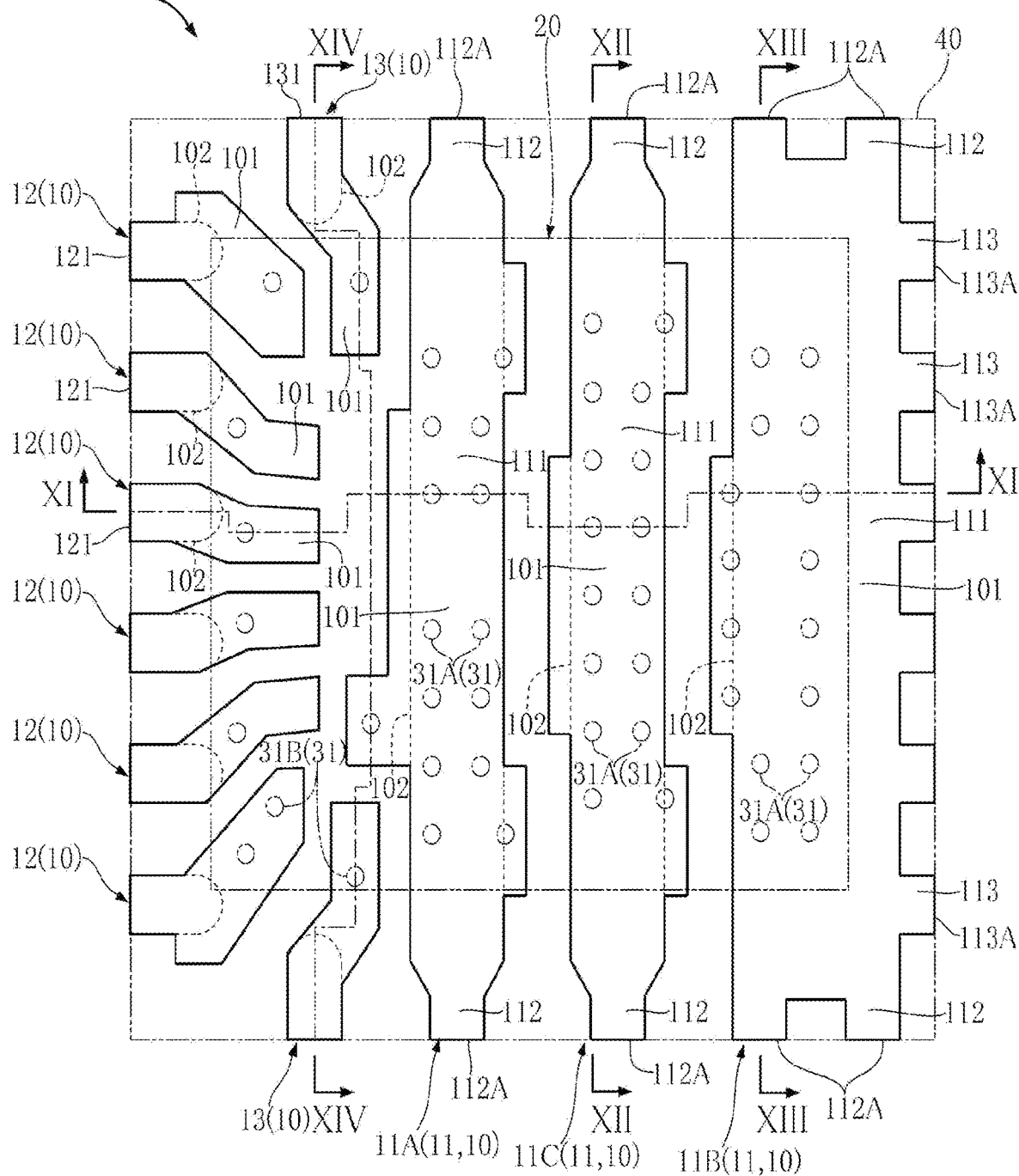
FIG. 3 is a plan view of the semiconductor device corresponding to FIG. 2, which is further seen through a semiconductor element.

In the description of the semiconductor device A10, a thickness direction z of the conductive member 10 is referred to as a "thickness direction z." A direction perpendicular to the thickness direction z is referred to as a "first direction x." A direction perpendicular to both the thickness direction z and the first direction x is referred to as a "second direction y." As illustrated in FIGS. 1 and 2, the semiconductor device A10 has a rectangular shape when viewed in the thickness direction z. Further, in the description of the semiconductor device A10, for convenience, the side on which a plurality of second leads (details will be described later) are located in the second direction y is referred to as "one side in the second direction y." The side on which a plurality of first leads 11 (details will be described later) are located in the second direction y is referred to as "the other side in the second direction y."

As illustrated in FIG. 2, the conductive member 10 supports the semiconductor element 20 and, at the same time, forms a terminal for mounting the semiconductor device A10 on a wiring board. As illustrated in FIGS. 11 to 14, the conductive member 10 is partially covered with the sealing resin 40. The conductive member 10 has a main surface 101 and a back surface 102 that face opposite to each other in the thickness direction z. The main surface 101 faces one side in the thickness direction z and faces the semiconductor element 20. The semiconductor element 20 is supported by the main surface 101. The main surface 101 is covered with the sealing resin 40. The back surface 102 faces the other side in the thickness direction z. The conductive member 10 includes a single lead frame. The lead frame is made of a material containing copper (Cu) or a copper alloy, for example. The conductive member 10 includes the plurality of first leads 11, the plurality of second leads 12, and a pair of third leads 13.

Figure 4:
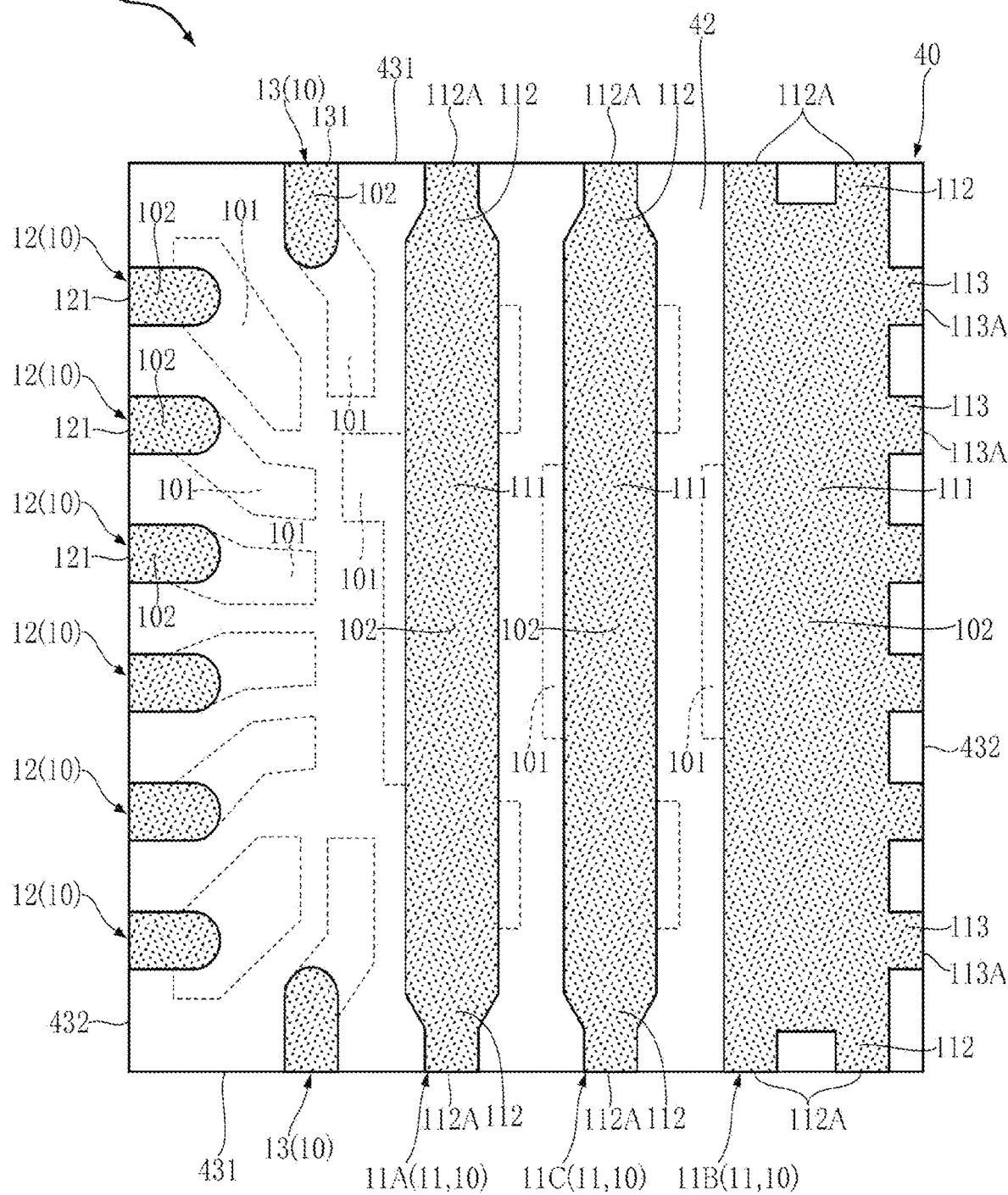
FIG. 4 is a bottom view of the semiconductor device illustrated in FIG. 1.

As illustrated in FIGS. 3 and 4, the plurality of first leads 11 have a band shape extending in the first direction x when viewed in the thickness direction z. The plurality of first leads 11 are arranged in the second direction y. In the example illustrated by the semiconductor device A10, the plurality of first leads 11 include three terminals, namely, a first input terminal 11A, a second input terminal 11B, and an output terminal 11C. The plurality of first leads 11 are arranged in the order of the first input terminal 11A, the output terminal 11C, and the second input terminal 11B from the one side to the other side in the second direction y. DC power (voltage) to be converted in the semiconductor device A10 is input to the first input terminal 11A and the second input terminal 11B. The first input terminal 11A is a positive electrode (P terminal). The second input terminal 11B is a negative electrode (N terminal). From the output terminal 11C, AC power (voltage) subjected to power conversion by the switching circuit 212A configured in the semiconductor element 20 is output.

As illustrated in FIG. 3, the first input terminal 11A is located between the plurality of second leads 12 and the output terminal 11C in the second direction y. The output terminal 11C is located between the first input terminal 11A and the second input terminal 11B in the second direction y. The first input terminal 11A and the output terminal 11C each include a main portion 111 and a pair of side portions 112. As illustrated in FIGS. 3 and 4, the main portion 111 extends in the first direction x. Regarding the plurality of first leads 11, the semiconductor element 20 is supported by the main surface 101 of the main portion 111. The pair of side portions 112 are connected to both ends of the main portion 111 in the first direction x. As illustrated in FIGS. 3, 4, 12, and 13, each of the pair of side portions 112 has a first end face 112A. The first end face 112A is connected to both the main surface 101 and the back surface 102 of the first lead 11, and faces in the first direction x. The first end face 112A is exposed on the surface of the sealing resin 40.

Figure 9:
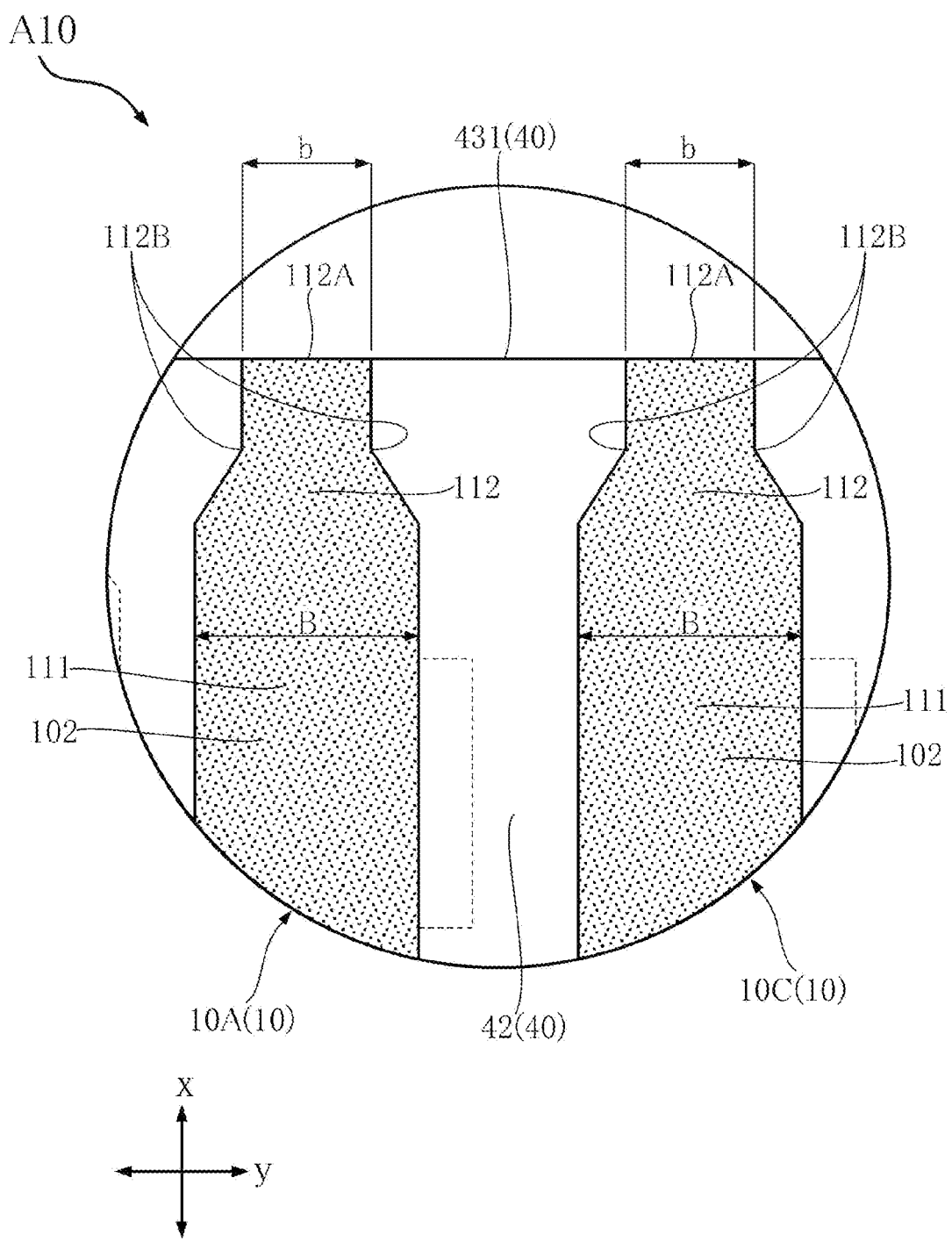
FIG. 9 is a partially enlarged view of FIG. 3.

As illustrated in FIG. 9, a constricted portion 112B is formed on each of the pair of side portions 112 of the first input terminal 11A and the output terminal 11C. The constricted portion 112B extends from the main surface 101 to the back surface 102 of the first lead 11, and has a recess from both sides in the second direction y toward the inside of the side portion 112. The constricted portion 112B is in contact with the sealing resin 40. Due to the constricted portion 112B, a dimension b in the second direction y of each of the pair of first end faces 112A is smaller than a dimension B in the second direction y of the back surface 102 of the main portion 111 on the first input terminal 11A and the output terminal 11C.

Figure 7:
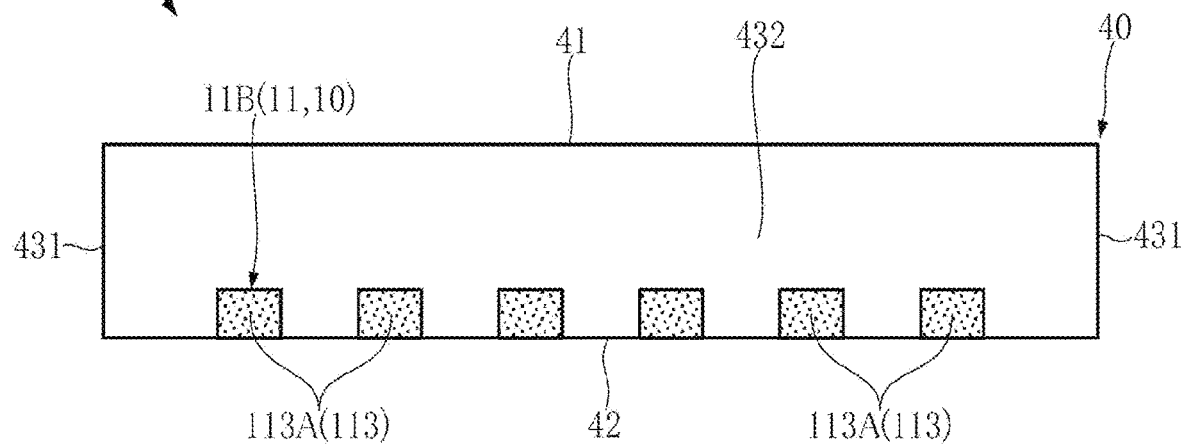
FIG. 7 is a right side view of the semiconductor device illustrated in FIG. 1.
Figure 11:
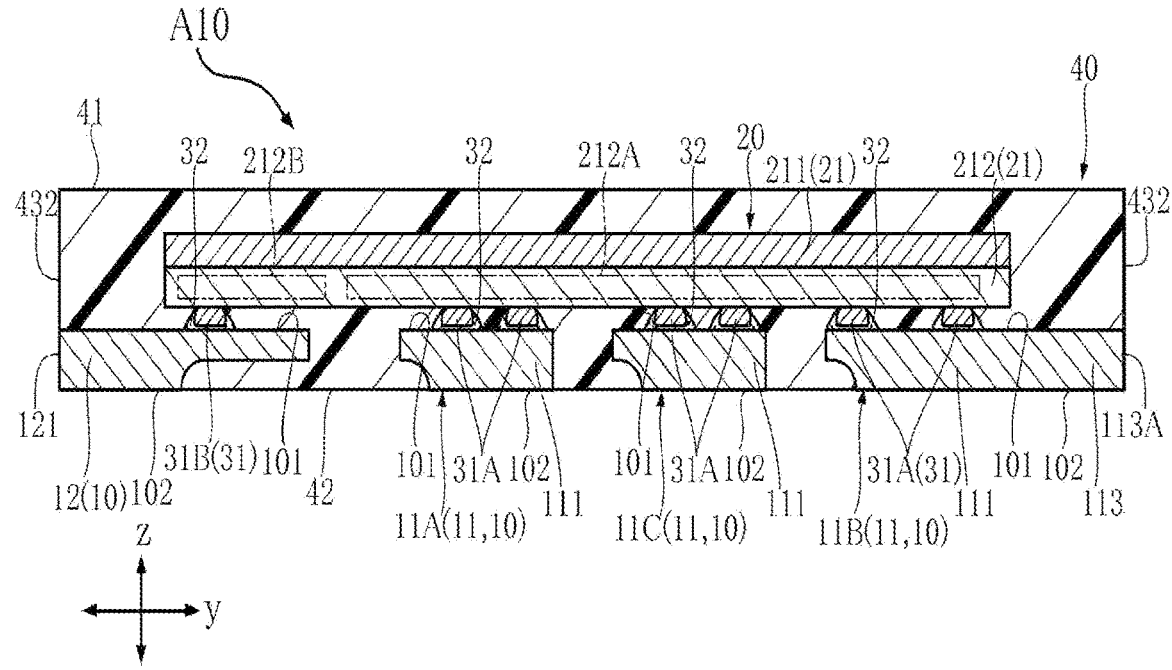
FIG. 11 is a cross-sectional view taken along line XI-XI in FIG. 3.

As illustrated in FIG. 3, the second input terminal 11B is located on the other side in the second direction y of the output terminal 11C. Therefore, the second input terminal 11B is located on the other side in the second direction y among the plurality of first leads 11. The second input terminal 11B includes the main portion 111, the pair of side portions 112, and a plurality of projections 113. The plurality of projections 113 project from the other side in the second direction y of the main portion 111. The space between two adjacent projections 113 is filled with the sealing resin 40. As illustrated in FIG. 11, each of the plurality of projections 113 has a sub-end face 113A. The sub-end face 113A is connected to both the main surface 101 and the back surface 102 of the second input terminal 11B, and faces the other side in the second direction y. The sub-end face 113A is exposed on the surface of the sealing resin 40. As illustrated in FIG. 7, a plurality of sub-end faces 113A are arranged at predetermined intervals in the first direction x.

Figure 10:
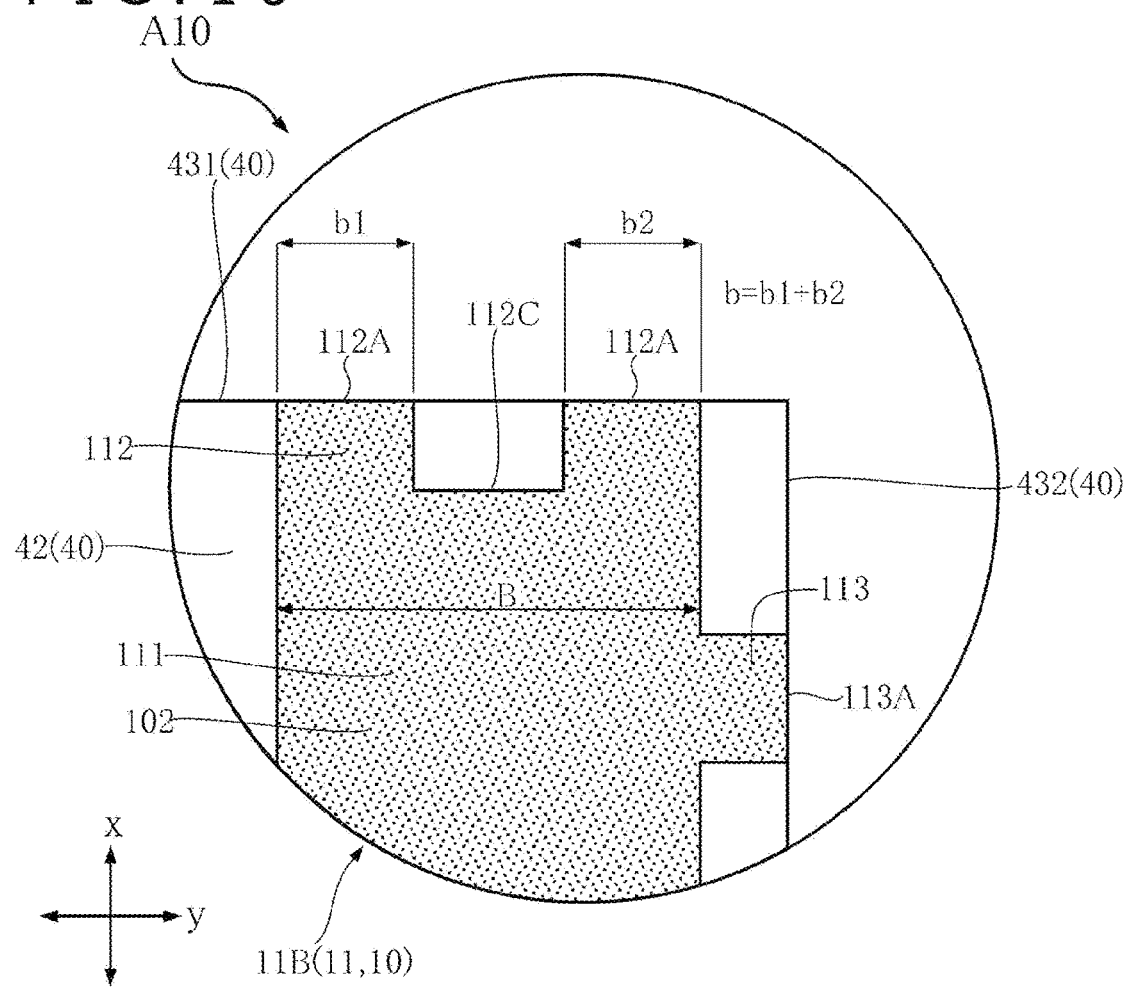
FIG. 10 is a partially enlarged view of FIG. 3.

As illustrated in FIG. 10, a cutout 112C is formed in each of the pair of side portions 112 of the second input terminal 11B. The cutout 112C extends from the main surface 101 to the back surface 102 of the second input terminal 11B, and forms a recess from the first end face 112A in the first direction x. As a result, the first end face 112A is divided into two regions separated from each other in the second direction y. Also with the cutout 112C, the dimension b in the second direction y of each of the pair of first end faces 112A is smaller than the dimension B in the second direction y of the back surface 102 of the main portion 111 on the second input terminal 11B. Incidentally, the dimension b here is the sum of a dimension b1 in the second direction y of one region of the first end face 112A and a dimension b2 in the second direction y of the other region of the first end face 112A (b=b1+b2). The cutout 112C is filled with the sealing resin 40.

As illustrated in FIGS. 3 and 4, in each of the plurality of first leads 11, the area of the main surface 101 is larger than the area of the back surface 102. In the example illustrated by the semiconductor device A10, the areas of the back surfaces 102 of the first input terminal 11A and the output terminal 11C are equal to each other. The area of the back surface 102 of the second input terminal 11B is larger than the area of the back surface 102 of each of the first input terminal 11A and the output terminal 11C.

At each of the first input terminal 11A, the second input terminal 11B, and the output terminal 11C, the main surface 101 of the main portion 111 on which the semiconductor element 20 is supported may be plated with silver (Ag), for example. Further, in each of the first input terminal 11A, the second input terminal 11B, and the output terminal 11C, the back surface 102, the pair of first end faces 112A, and the plurality of sub-end faces 113A exposed on the surface of the sealing resin 40 may be plated with tin (Sn), for example. Incidentally, instead of tin plating, plating of a plurality of metals such as nickel (Ni), palladium (Pd), and gold (Au) stacked in this order may be adopted.

Figure 8:
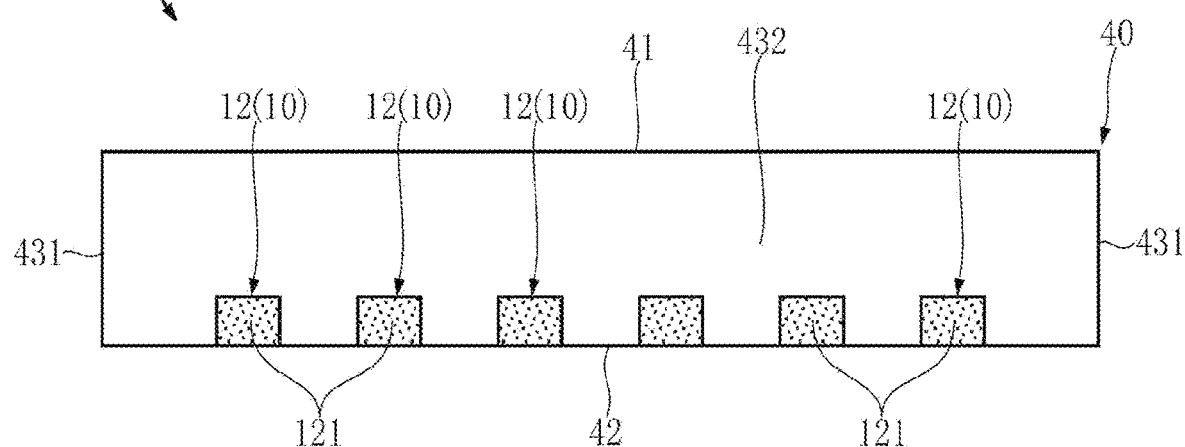
FIG. 8 is a left side view of the semiconductor device illustrated in FIG. 1.

As illustrated in FIG. 3, the plurality of second leads 12 are located on the one side in the second direction y of the plurality of first leads 11. Any one of the plurality of second leads 12 is a ground terminal of the control circuit 212B configured in the semiconductor element 20. Power (voltage) for driving the control circuit 212B or an electric signal to be transmitted to the control circuit 212B is input to each of the other plurality of second leads 12. As illustrated in FIGS. 3, 4, and 11, each of the plurality of second leads 12 has a second end face 121. The second end face 121 is connected to both the main surface 101 and the back surface 102 of the second lead 12, and faces the one side in the second direction y. The second end face 121 is exposed on the surface of the sealing resin 40. As illustrated in FIG. 8, a plurality of second end faces 121 are arranged at predetermined intervals in the first direction x.

As illustrated in FIGS. 3 and 4, in each of the plurality of second leads 12, the area of the main surface 101 is larger than the area of the back surface 102. Incidentally, the areas of the back surfaces 102 of the plurality of second leads 12 are all the same. For example, silver plating may be applied to the back surfaces 102 of the plurality of second leads 12 on which the semiconductor element 20 is supported. Further, the back surfaces 102 and the second end faces 121 of the plurality of second leads 12 exposed on the surface of the sealing resin 40 may be plated with tin, for example. Incidentally, instead of tin plating, plating of a plurality of metals such as nickel, palladium, and gold stacked in this order may be adopted, for example.

Figure 14:
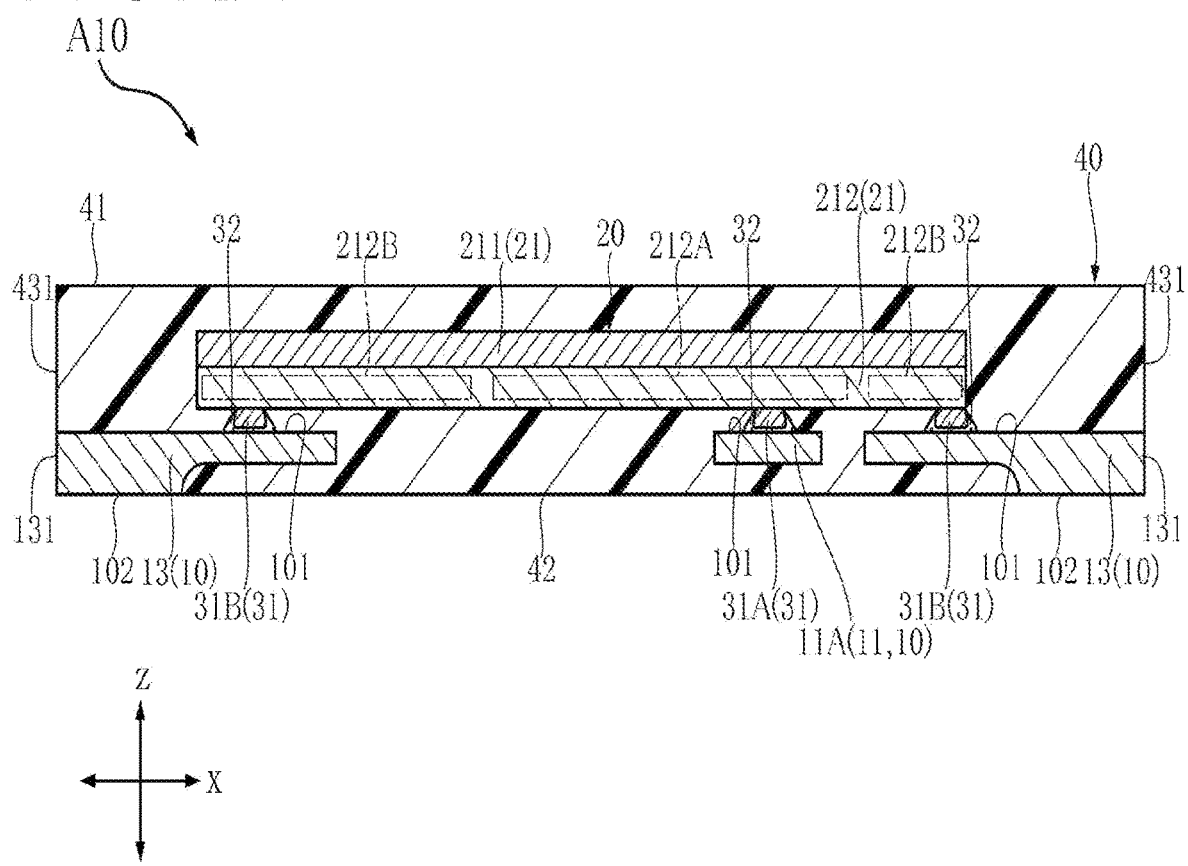
FIG. 14 is a cross-sectional view taken along line XIV-XIV in FIG. 3.

As illustrated in FIG. 3, the pair of third leads 13 are located between a first lead 11 (first input terminal 11A) and the plurality of second leads 12 in the second direction y. The pair of third leads 13 are separated from each other in the first direction x. An electric signal, for example, to be transmitted to the control circuit 212B configured in the semiconductor element 20 is input to each of the pair of third leads 13. As illustrated in FIGS. 3, 4, and 14, each of the pair of third leads 13 has a third end face 131. The third end face 131 is connected to both the main surface 101 and the back surface 102, and faces in the first direction x. The third end face 131 is exposed on the surface of the sealing resin 40. The third end faces 131 are arranged in the second direction y together with the first end faces 112A of the plurality of first leads 11.

As illustrated in FIGS. 3 and 4, in each of the pair of third leads 13, the area of the main surface 101 is larger than the area of the back surface 102. For example, silver plating may be applied to the main surfaces 101 of the pair of third leads 13 on which the semiconductor element 20 is supported. Further, the back surfaces 102 and the third end faces 131 of the pair of third leads 13 exposed on the surface of the sealing resin 40 may be plated with tin, for example. Incidentally, instead of tin plating, plating of a plurality of metals such as nickel, palladium, and gold stacked in this order may be adopted, for example.

Figure 15:
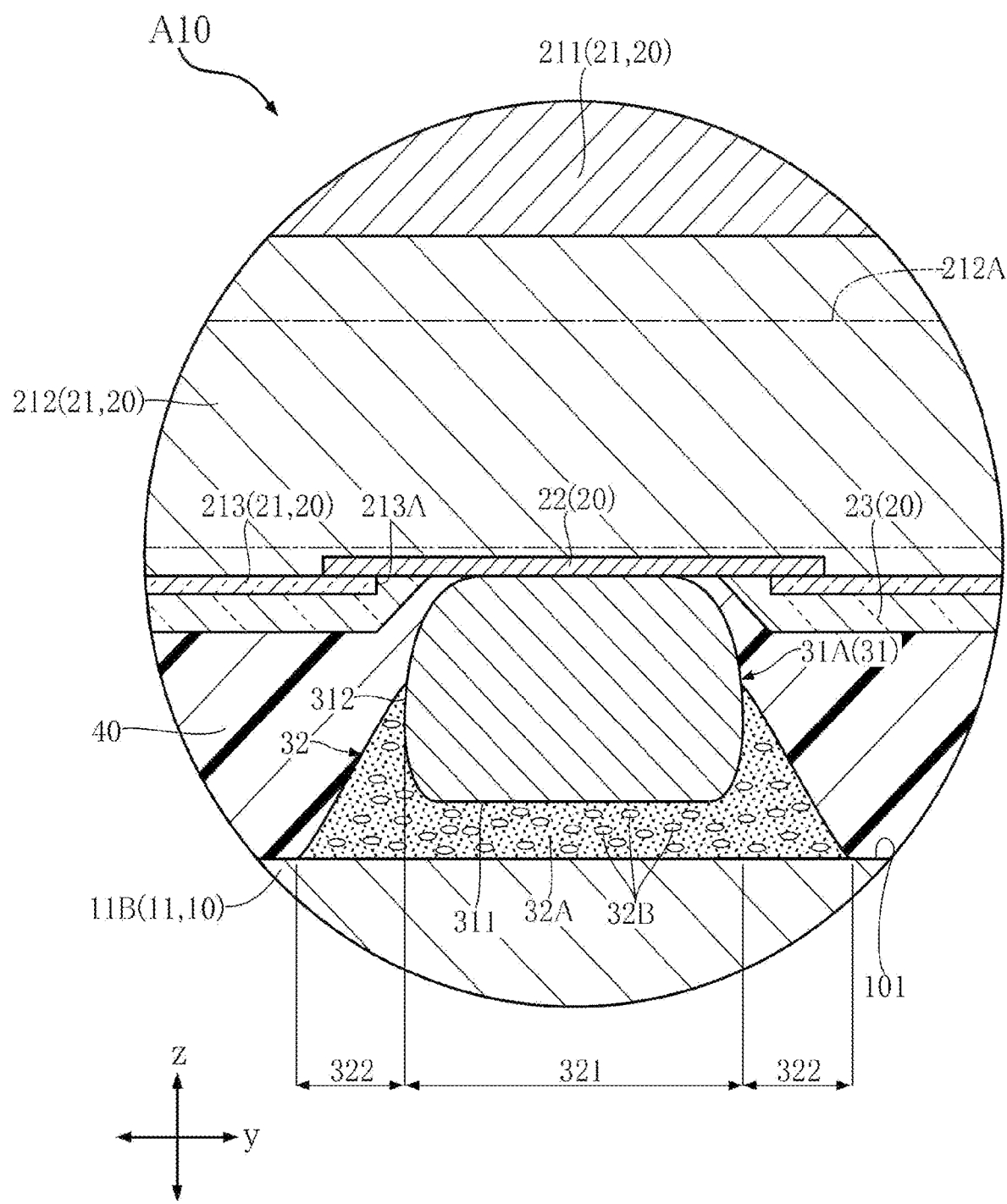
FIG. 15 is a partially enlarged view of FIG. 11.
Figure 16:
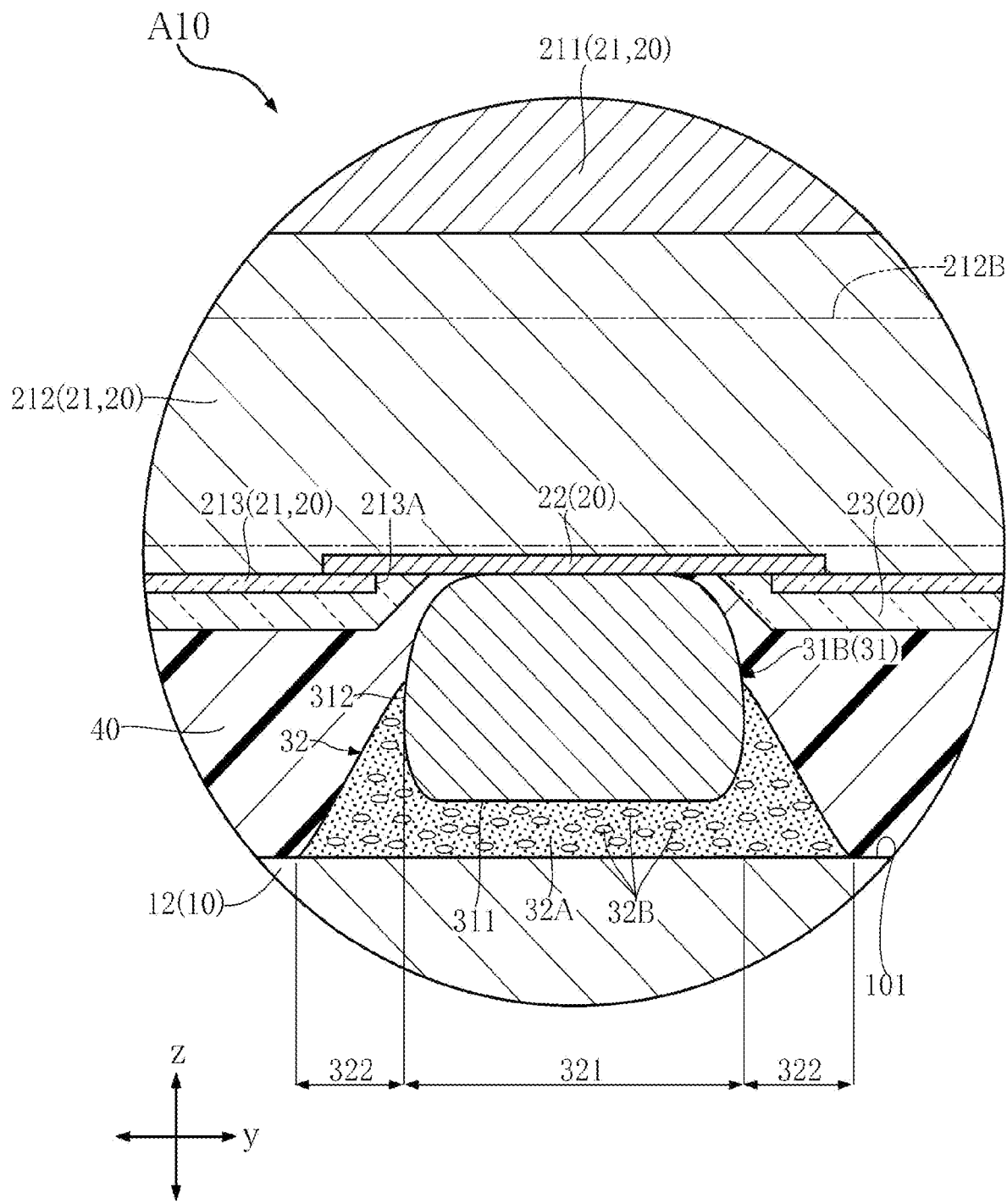
FIG. 16 is a partially enlarged view of FIG. 11.

As illustrated in FIGS. 11 to 14, the semiconductor element 20 is electrically bonded to the conductive member 10 (the plurality of first leads 11, the plurality of second leads 12, and the pair of third leads 13) by flip-chip bonding via the plurality of electrodes 31 and the bonding layers 32. Each of the plurality of electrodes 31 and the bonding layer 32 form a bonding portion. The semiconductor element 20 is covered with the sealing resin 40. As illustrated in FIGS. 15 and 16, the semiconductor element 20 has an element main body 21, a plurality of pads 22, and a surface protective film 23.

The element main body 21 forms the main portion of the semiconductor element 20. As illustrated in FIGS. 15 and 16, the element main body 21 has a substrate 211, a semiconductor layer 212, and a passivation film 213.

As illustrated in FIGS. 15 and 16, the substrate 211 supports the semiconductor layer 212, the passivation film 213, the plurality of electrodes 31, and the surface protective film 23 below the substrate 211. The substrate 211 is made of a semiconductor material. The semiconductor material contains silicon (Si) or silicon carbide (SiC), for example, as a main component. The thickness of the substrate 211 is 100 to 300 μm, both inclusive, for example.

As illustrated in FIGS. 11 to 14, the semiconductor layer 212 is located on a side of the substrate 211 in the thickness direction z so as to face the main surface 101 of the conductive member 10. The semiconductor layer 212 is stacked on the substrate 211. The semiconductor layer 212 includes a plurality of types of p-type semiconductors and n-type semiconductors based on the difference in the doped element content. The semiconductor layer 212 includes the switching circuit 212A and the control circuit 212B electrically connected to the switching circuit 212A. The switching circuit 212A is a metal-oxide-semiconductor field-effect transistor (MOSFET), an insulated gate bipolar transistor (IGBT), or another transistor. In the example illustrated by the semiconductor device A10, the switching circuit 212A is divided into two regions, namely, a high voltage region (upper arm circuit) and a low voltage region (lower arm circuit). Each region is composed of one n-channel MOSFET. The control circuit 212B includes a gate driver for driving the switching circuit 212A, a bootstrap circuit corresponding to a high voltage region of the switching circuit 212A, and the like constituted therein, and performs control for driving the switching circuit 212A normally. Incidentally, a wiring layer (not illustrated) is configured in the semiconductor layer 212. The switching circuit 212A and the control circuit 212B are electrically connected to each other by the wiring layer.

As illustrated in FIGS. 15 and 16, the lower surface of the semiconductor layer 212 is covered with the passivation film 213. The passivation film 213 has electrical insulation. The passivation film 213 is composed of a silicon oxide film ($SiO_2$) in contact with the lower surface of the semiconductor layer 212 and a silicon nitride film ($Si_3N_4$) stacked on the silicon oxide film, for example. The passivation film 213 is provided with a plurality of openings 213A penetrating in the thickness direction z.

As illustrated in FIGS. 15 and 16, the plurality of pads 22 face the main surface 101 of the conductive member 10. The plurality of pads 22 are arranged in contact with the semiconductor layer 212 of the element main body 21. As a result, each of the plurality of pads 22 is electrically connected to either the switching circuit 212A of the semiconductor layer 212 or the control circuit 212B of the semiconductor layer 212. Each of the plurality of pads 22 contains aluminum (Al) or copper in its composition. Each of the other plurality of pads 22 may be composed of a plurality of metal layers in which copper, nickel, and palladium are stacked downward from the semiconductor layer 212 in this order. Each of the plurality of pads 22 is in contact with the passivation film 213 of the element main body 21. A part of each of the plurality of pads 22 is exposed at the opening 213A of the passivation film 213.

As illustrated in FIGS. 15 and 16, the passivation film 213 of the element main body 21 is covered with the surface protective film 23. The surface protective film 23 is in contact with the passivation film 213 and the plurality of pads 22. In the semiconductor device A10, each of the plurality of electrodes 31 is separated from the surface protective film 23. Unlike this configuration, each of the plurality of electrodes 31 may be in contact with the surface protective film 23. The surface protective film 23 has electrical insulation. The surface protective film 23 is made of a material containing polyimide, for example.

As illustrated in FIGS. 15 and 16, the plurality of electrodes 31 are individually formed with respect to the plurality of pads 22 of the semiconductor element 20, and protrude from the plurality of pads 22 toward the main surface 101 of the conductive member 10. Each of the plurality of electrodes 31 is electrically connected to either the switching circuit 212A of the semiconductor layer 212 or the control circuit 212B of the semiconductor layer 212 via any of the plurality of pads 22. Each of the plurality of electrodes 31 is electrically bonded to the main surface 101 via the bonding layer 32. The plurality of electrodes 31 include a plurality of first electrodes 31A and a plurality of second electrodes 31B. Each of the plurality of first electrodes 31A is electrically conductive to the switching circuit 212A of the semiconductor layer 212 and is electrically bonded to the main surface 101 of any of the plurality of first leads 11. Each of the plurality of second electrodes 31B is electrically conductive to the control circuit 212B of the semiconductor layer 212 and is electrically bonded to the main surface 101 of any of the plurality of second leads 12 or the main surface 101 of any of the pair of third leads 13. In the semiconductor device A10, the composition of each of the plurality of electrodes 31 includes gold. In addition, each composition of the plurality of electrodes 31 may include at least either gold or silver.

As illustrated in FIGS. 15 and 16, each of the plurality of electrodes 31 has a facing surface 311 and a side surface 312. The facing surface 311 faces the main surface 101 of the conductive member 10. The side surface 312 is connected to the facing surface 311 and faces in a direction perpendicular to the thickness direction z. At least the side surface 312 of any one of the plurality of electrodes 31 bulges out in a direction perpendicular to the thickness direction z.

As illustrated in FIGS. 11 to 14, the bonding layer 32 electrically bonds the main surface 101 of the conductive member 10 to the plurality of electrodes 31. As illustrated in FIGS. 15 and 16, the bonding layer 32 includes a first region 32A including a metal portion and a second region 32B. The first region 32A has conductivity. The first region 32A is a combination of sintered metal particles, that is, a sintered body. The sintered body corresponds to a metal portion. The composition of the sintered body contains silver. The second region 32B has electrical insulation. The second region 32B includes at least a resin portion. The resin portion is made of a material containing a synthetic resin as a binder. The synthetic resin is a thermosetting resin such as an epoxy resin. The Young's modulus of the resin portion is smaller than that of the first region 32A. The second region 32B may have following states. First, the second region 32B includes a resin portion. Secondly, the resin portion and vacancies are mixed in the second region 32B. The volume of the second region 32B is 15% to 35%, both inclusive, of the total volume of the bonding layer 32.

As illustrated in FIGS. 15 and 16, the bonding layer 32 is in contact with the main surface 101 of the conductive member 10 and with the facing surface 311 and the side surface 312 of each of the plurality of electrodes 31. The bonding layer 32 has a first portion 321 and a second portion 322. The first portion 321 is located between the main surface 101 and the facing surface 311 of any one of the plurality of electrodes 31. The first portion 321 is in contact with the main surface 101 and the facing surface 311. The second portion 322 is connected to the first portion 321 and protrudes outward from the side surface 312 of any one of the plurality of electrodes 31 when viewed in the thickness direction z. The cross-sectional area of the second portion 322 in the direction perpendicular to the thickness direction z gradually decreases from the facing surface 311 toward the semiconductor element 20.

As illustrated in FIGS. 11 to 14, the sealing resin 40 is in contact with the main surface 101 of the conductive member 10 and covers the semiconductor element 20 and the plurality of electrodes 31. As illustrated in FIGS. 5 to 8, the sealing resin 40 has a top surface 41, a bottom surface 42, a pair of first side surfaces 431, and a pair of second side surfaces 432. The sealing resin 40 is made of a material containing a black epoxy resin, for example.

As illustrated in FIGS. 11 to 14, the top surface 41 faces the same side as the main surface 101 of the conductive member 10 faces in the thickness direction z. As illustrated in FIGS. 5 to 8, the bottom surface 42 faces the side opposite to the side which the top surface 41 faces. As illustrated in FIG. 4, the back surface 102 of the plurality of first leads 11, the back surface 102 of the plurality of second leads 12, and the back surface 102 of the pair of third leads 13 are exposed on the bottom surface 42.

Figure 12:
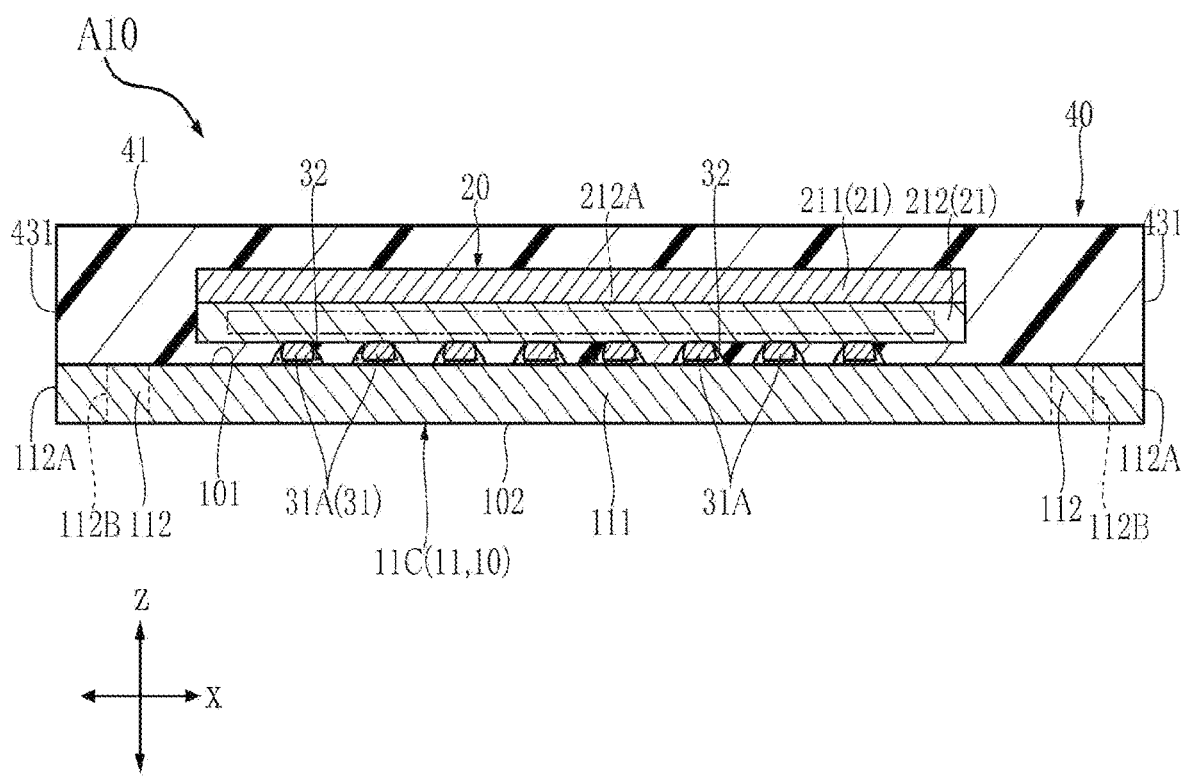
FIG. 12 is a cross-sectional view taken along line XII-XII in FIG. 3.
Figure 13:
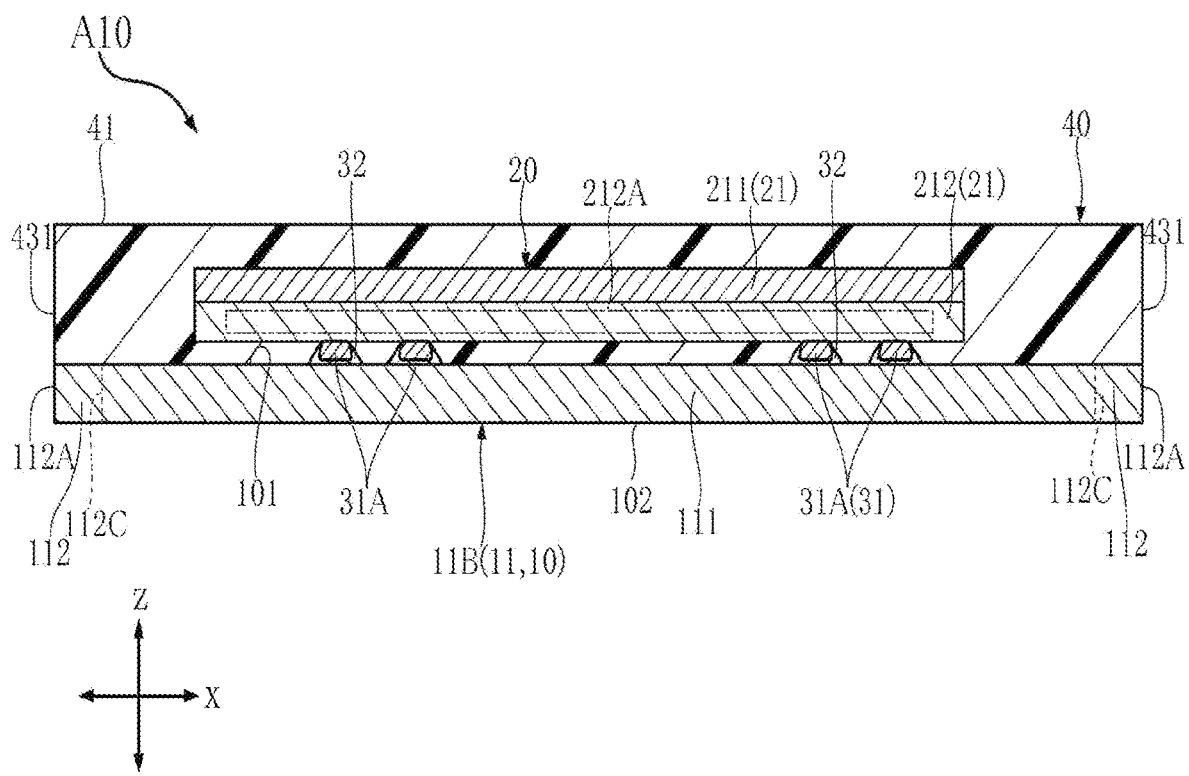
FIG. 13 is a cross-sectional view taken along line XIII-XIII in FIG. 3.

As illustrated in FIGS. 7 and 8, the pair of first side surfaces 431 are connected to both the top surface 41 and the bottom surface 42, and face in the first direction x. The pair of first side surfaces 431 are separated from each other in the first direction x. As illustrated in FIGS. 12 to 14, on each of the pair of first side surfaces 431, the first end faces 112A of the plurality of first leads 11 and the third end face 131 of the third lead 13 are exposed so as to be flush with the first side surface 431.

Figure 5:
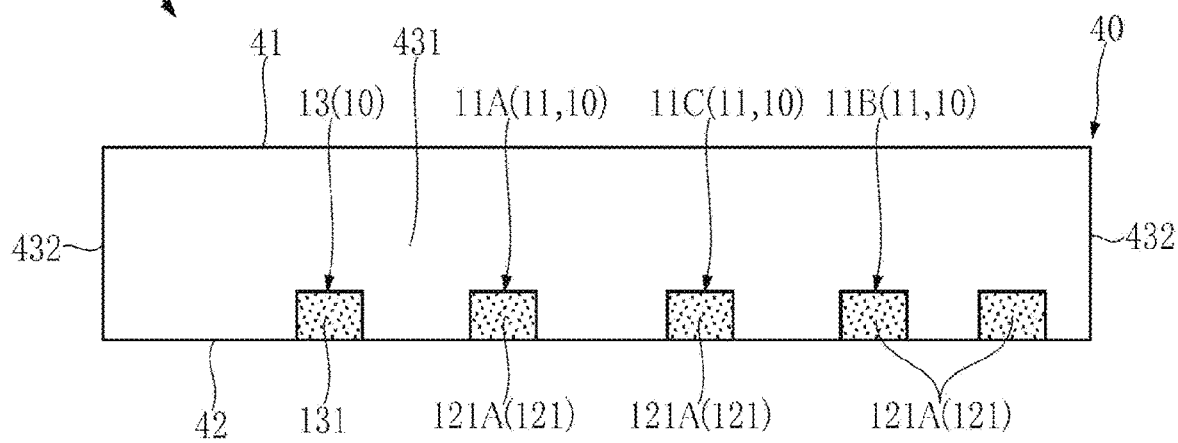
FIG. 5 is a front view of the semiconductor device illustrated in FIG. 1.
Figure 6:
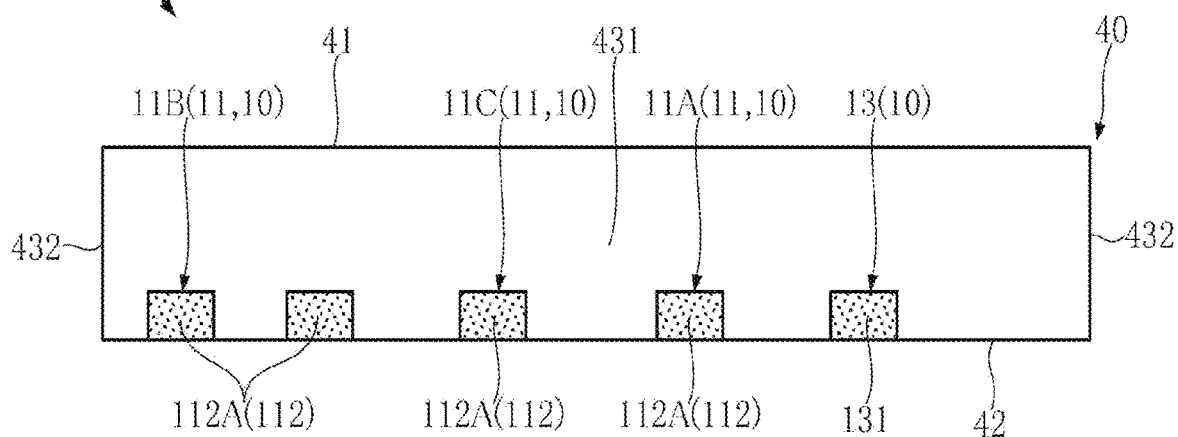
FIG. 6 is a rear view of the semiconductor device illustrated in FIG. 1.

As illustrated in FIGS. 5 and 6, the pair of second side surfaces 432 are connected to any of the top surface 41, the bottom surface 42, and the pair of first side surfaces 431, and face in the second direction y. The pair of second side surfaces 432 are separated from each other in the second direction y. As illustrated in FIG. 11, the second end faces 121 of the plurality of second leads 12 are exposed on the second side surface 432 located on the one side in the second direction y so as to be flush with the second side surface 432. The plurality of sub-end faces 113A of the second input terminal 11B (first lead 11) are exposed on the second side surface 432 located on the other side in the second direction y so as to be flush with the second side surface 432.

Figure 17:
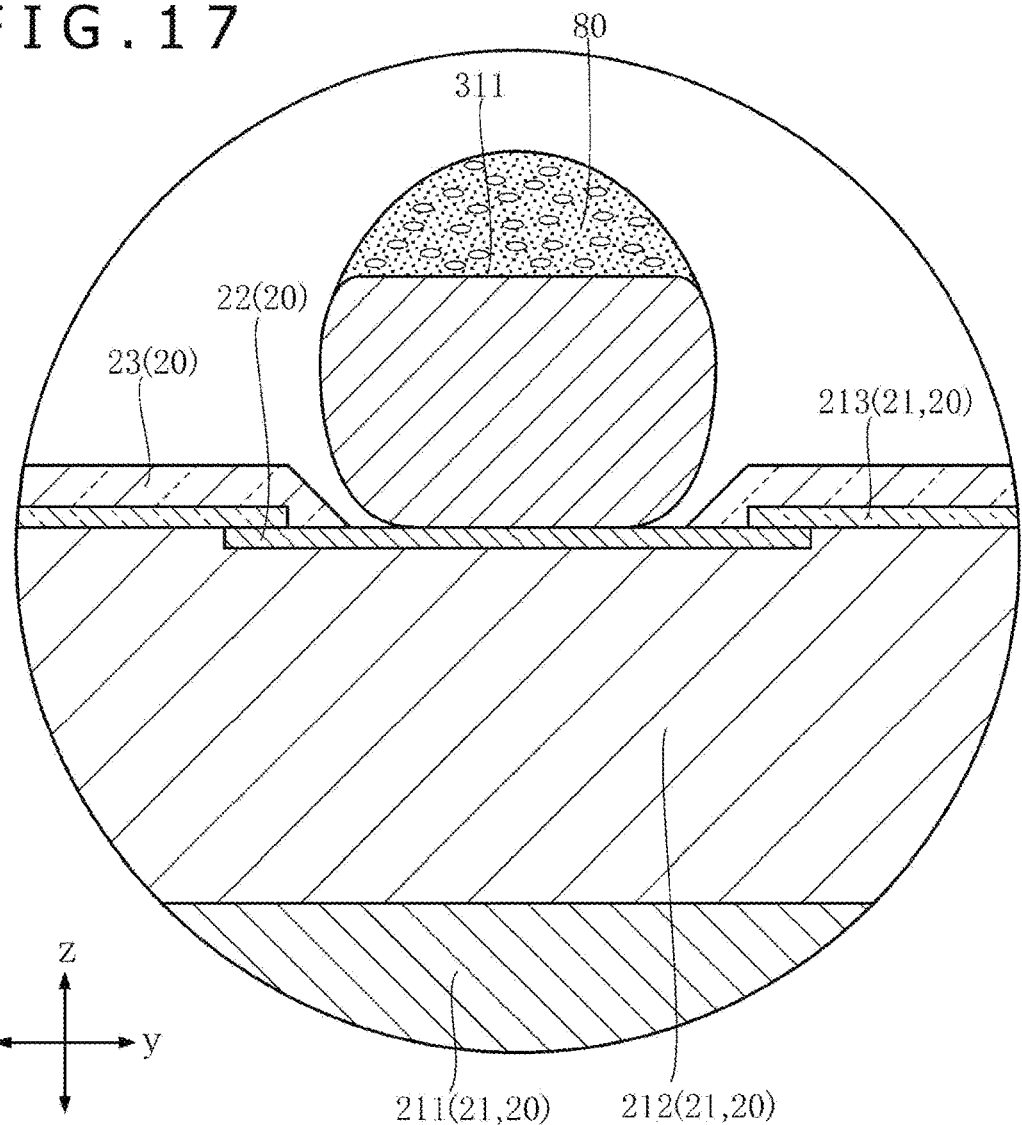
FIG. 17 is a partially enlarged cross-sectional view for illustrating a manufacturing process of the semiconductor device illustrated in FIG. 1.

Next, an example of a method for manufacturing the semiconductor device A10 will be described with reference to FIGS. 17 to 19. Here, the cross-sectional position of FIG. 17 is the same as that of FIG. 15. The cross-sectional position of each of FIGS. 18 and 19 is the same as that of FIG. 11.

First, as schematically illustrated in FIG. 17, the plurality of electrodes 31 are individually formed with respect to the plurality of pads 22 of the semiconductor element 20. The plurality of pads 22 are provided on one side of the semiconductor element 20 in the thickness direction z. The plurality of electrodes 31 are formed by wire bonding. That is, each of the plurality of electrodes 31 corresponds to a ball bonding portion. After that, a bonding material 80 is applied to the plurality of electrodes 31. The bonding material 80 is made of a material containing metal particles and a synthetic resin. The composition of the metal particles contains silver. The synthetic resin is a thermosetting resin such as an epoxy resin.

Figure 18:
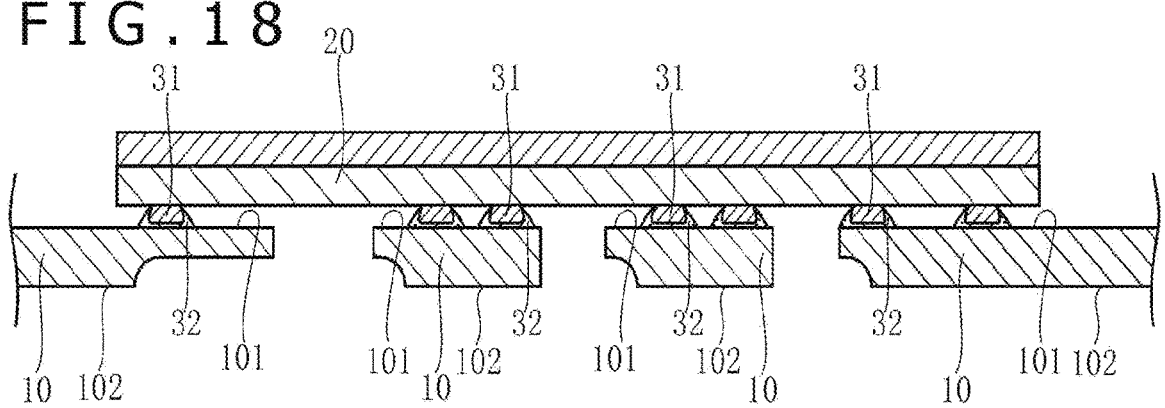
FIG. 18 is a cross-sectional view for illustrating the manufacturing process of the semiconductor device illustrated in FIG. 1.

Next, as illustrated in FIG. 18, the plurality of electrodes 31 are electrically bonded to the main surface 101 of the conductive member 10 which has the main surface 101 facing in the thickness direction z. In this step, the semiconductor element 20 is inverted in the thickness direction z from the state illustrated in FIG. 17 such that the plurality of electrodes 31 face the main surface 101. Further, in this step, after the bonding material 80 is brought into contact with the main surface 101, the bonding material 80 is fired under atmospheric pressure. As a result, the metal particles contained in the bonding material 80 are combined with each other to form a sintered body. The sintered body corresponds to a metal portion containing a metal. The synthetic resin contained in the bonding material 80 shrinks and is thermally cured. This shrinkage promotes the binding of metal particles. To be specific, due to this shrinkage, the metal particles are subjected to compressive forces thereof acting on each other, so that the binding of the metal particles is promoted. By this step, the plurality of electrodes 31 are electrically bonded to the main surface 101. The fired bonding material 80 corresponds to the bonding layer 32 of the semiconductor device A10.

Figure 19:
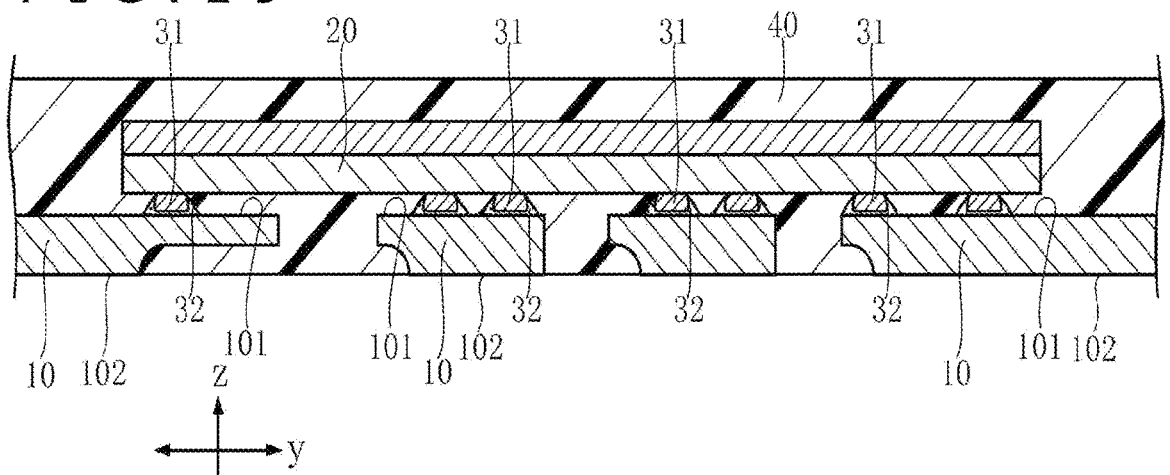
FIG. 19 is a cross-sectional view for illustrating the manufacturing process of the semiconductor device illustrated in FIG. 1.

Next, as illustrated in FIG. 19, the sealing resin 40 is formed. The sealing resin 40 is in contact with the main surface 101 of the conductive member 10 and covers the semiconductor element 20 and the plurality of electrodes 31. The sealing resin 40 is formed by transfer-mold forming. Then, the conductive member 10 and the sealing resin 40 are cut in each of the first direction x and the second direction y with use of a dicing blade, for example, to obtain a plurality of pieces. Each of the plurality of pieces is formed as the semiconductor device A10.

Modification Example

Next, the semiconductor device A11, which is a modification example of the semiconductor device A10, will be described with reference to FIG. 20. Here, the cross-sectional position of FIG. 20 is the same as that of FIG. 15.

Figure 20:
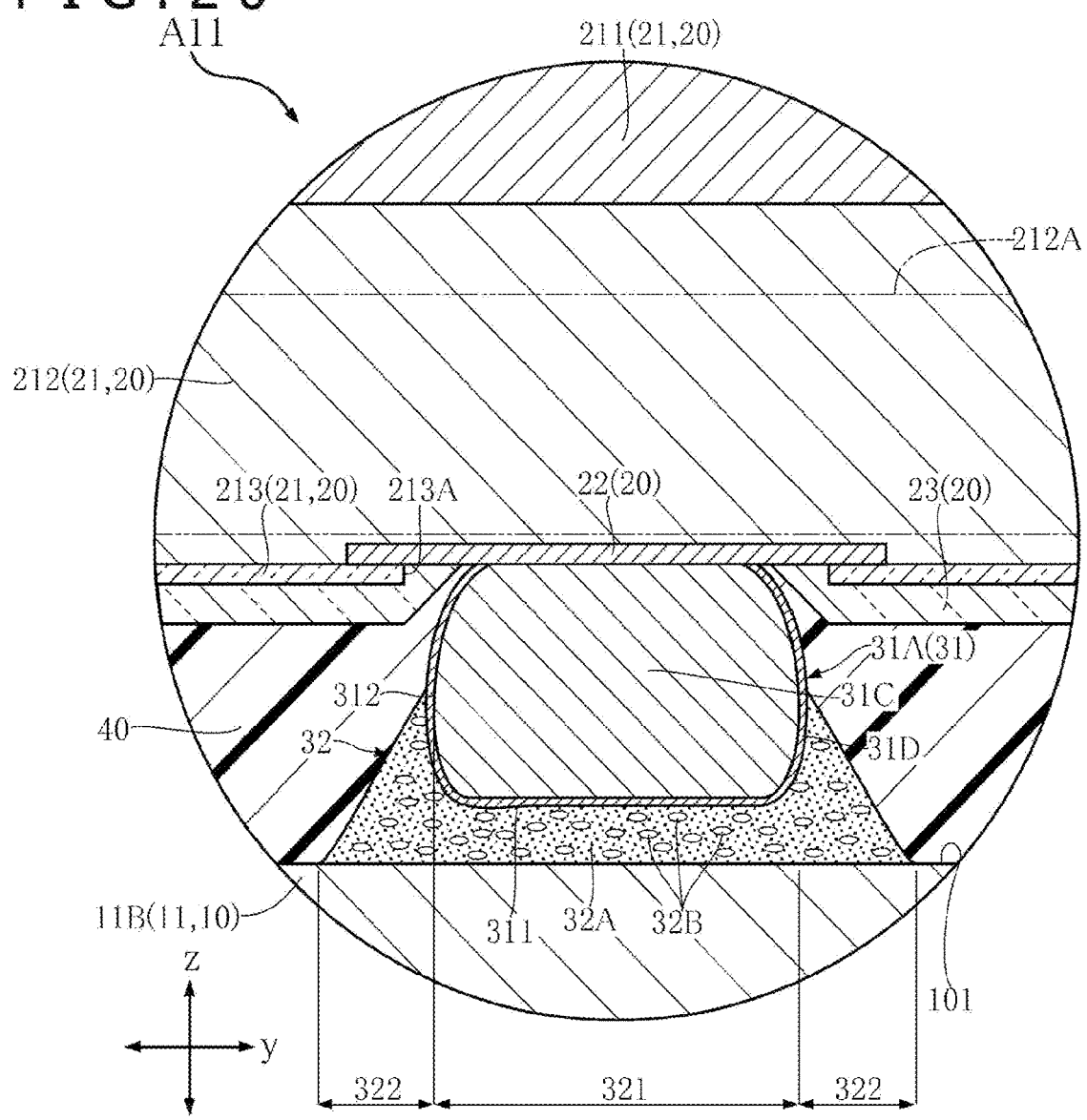
FIG. 20 is a partially enlarged cross-sectional view of a modification example of the semiconductor device illustrated in FIG. 1.

As illustrated in FIG. 20, in the semiconductor device A11, the configuration of the plurality of electrodes 31 is different from that of the semiconductor device A10. Each of the plurality of electrodes 31 of the semiconductor device A11 includes a main portion 31C formed on the pad 22 of the semiconductor element 20 and a sub-portion 31D formed so as to cover the main portion 31C. The composition of the main portion 31C contains copper. In addition, the composition of the main portion 31C may contain at least either gold or silver. The main portion 31C is formed by wire bonding in a manner similar to that of the step illustrated in FIG. 17. The composition of the sub-portion 31D contains palladium. The sub-portion 31D is formed by electrolytic plating. In this modification, in each of the plurality of electrodes 31, the main portion 31C is a copper bump and the sub-portion 31D is a palladium plating layer.

Next, the function effect of the semiconductor device A10 will be described.

The semiconductor device A10 is provided with the plurality of electrodes 31 that are individually formed with respect to the plurality of pads 22 of the semiconductor element 20 and that protrude from the plurality of pads 22 toward the main surface 101 of the conductive member 10; and the bonding layer 32 for electrically bonding the main surface 101 to the plurality of electrodes 31. The bonding layer 32 includes the first region 32A having conductivity and the second region 32B having electrical insulation. The first electrode 31A is a combination of sintered metal particles. At least a part of the second region 32B is made of a material containing a synthetic resin. By adopting this configuration, first, when the semiconductor device A10 is manufactured, the bonding material 80 does not melt in the step of bonding the plurality of electrodes 31 to the main surface 101 illustrated in FIG. 18, so that the plurality of electrodes 31 are prevented from being short-circuited. Secondly, in the same step, the bonding material 80 is prevented from spreading in the in-plane directions of the main surface 101 (the direction that is perpendicular to the thickness direction z and includes the first direction x and the second direction y), so that a short circuit of the plurality of electrodes 31 is prevented. Further, when the thermal stress caused by the heat generated from the semiconductor element 20 acts on the bonding layer 32, a part of the thermal stress is borne by the second region 32B. As a result, the thermal stress acting on the first region 32A is reduced, so that the occurrence of cracks on the bonding layer 32 can be suppressed. Therefore, according to the semiconductor device A10, the occurrence of cracks can be suppressed on the bonding layer 32 while short circuits of the plurality of electrodes 31 are prevented.

In the step of electrically bonding the plurality of electrodes 31 to the main surface 101 of the conductive member 10 illustrated in FIG. 18 in the manufacturing process of the semiconductor device A10, by firing the bonding material 80 under atmospheric pressure after the bonding material 80 is brought into contact with the main surface 101, the plurality of electrodes 31 are electrically bonded to the main surface 101. In this case, first, the residual stress in the bonding layer 32, the residual stress being generated by firing the bonding material 80, is reduced as compared with a case of firing the bonding material 80 in a state of being forcibly pressurized from the outside by using a pressurizing mechanism. Secondly, the bonding layer 32 formed by electrically bonding the plurality of electrodes 31 to the main surface 101 covers the side surface 312 of any of the plurality of electrodes 31. As a result, the residual stress in the bonding layer 32, the residual stress being generated by firing the bonding material 80, is borne by both ends in a direction perpendicular to the thickness direction z of the first portion 321 and the second portion 322 which cover the side surface 312. As a result, the occurrence of cracks on the bonding layer 32 can be suppressed more effectively.

The second region 32B of the bonding layer 32 preferably includes vacancies. As a result, the second region 32B becomes more flexible than the first region 32A of the bonding layer 32, so that the thermal stress acting on the first region 32A is more effectively reduced. The volume of the second region 32B is 15% to 35%, both inclusive, of the total volume of the bonding layer 32. Due to this, the effect of reducing the thermal stress acting on the first region 32A is fully exhibited.

On the other hand, in a case where the volume of the second region 32B is less than 15% of the total volume of the bonding layer 32, the occurrence of cracks on the bonding layer 32 cannot be effectively suppressed, which is not preferable. On the other hand, in a case where the volume of the second region 32B exceeds 35% of the total volume of the bonding layer 32, the volume of the second region 32B including the resin portion becomes relatively large. As a result, the electrical resistance between the main surface 101 and the plurality of electrodes 31 increases, which is not preferable.

The Young's modulus of the synthetic resin contained in the second region 32B of the bonding layer 32 is smaller than that of the first region 32A. As a result, in a case where deformation such as warpage occurs in the semiconductor device A10, each bonding portion including the bonding layer 32 easily follows the warpage of the semiconductor device A10 (in other words, the warpage of the conductive member 10). Accordingly, the occurrence of defects such as poor bonding of the plurality of electrodes 31 to the main surface 101 of the conductive member 10 is suppressed.

The bonding layer 32 has the first portion 321 and the second portion 322 connected to the first portion 321. The first portion 321 is located between the main surface 101 of the conductive member 10 and the facing surface 311 of any of the plurality of electrodes 31. The second portion 322 protrudes outward from the side surface 312 of any of the plurality of electrodes 31 when viewed in the thickness direction z. The second portion 322 is in contact with the side surface 312 of any of the plurality of electrodes 31. As a result, the contact area of each of the plurality of electrodes 31 with respect to the bonding layer 32 is further expanded. As a result, the bonding strength of the plurality of electrodes 31 can be increased with respect to the conductive member 10.

The cross-sectional area of the second portion 322 of the bonding layer 32 in a direction perpendicular to the thickness direction z is gradually reduced from the facing surface 311 of any of the plurality of electrodes 31 toward the semiconductor element 20. Due to this, the thermal stress acting on the bonding layer 32 is dispersed, so that the occurrence of cracks on the bonding layer 32 can be suppressed more effectively.

At least the side surface 312 of any one of the plurality of electrodes 31 bulges out in a direction perpendicular to the thickness direction z. Due to this, the area of the interface between the side surface 312 and the second portion 322 of the bonding layer 32 is expanded, so that the thermal stress transmitted to the interface can be reduced. This contributes to suppressing the occurrence of cracks on the bonding layer 32.

In the semiconductor device A11, each of the plurality of electrodes 31 includes the main portion 31C formed on the pad 22 of the semiconductor element 20 and the sub-portion 31D formed so as to cover the main portion 31C. The composition of the main portion 31C contains copper. The composition of the sub-portion 31D contains palladium. By adopting this configuration, in the step of bonding the plurality of electrodes 31 to the main surface 101 illustrated in FIG. 18 in the manufacturing process of the semiconductor device A11, the thermal shock acting on the plurality of electrodes 31 caused by the firing of the bonding material 80 is reduced by the sub-portion 31D. As a result, the main portion 31C can be protected, and the manufacturing cost can be suppressed as compared with the semiconductor device A10.

Each of the plurality of electrodes 31 has a shorter length and a larger cross-sectional area than the bonding wire. Therefore, the parasitic resistance between the first lead 11 and the switching circuit 212A can be reduced as compared with a case where the first lead 11 and the plurality of pads 22 of the semiconductor element 20 are connected by bonding wires. When the parasitic resistance is reduced, the effect of reducing the on-resistance and noise in the switching circuit 212A can be obtained.

The switching circuit 212A is configured in the semiconductor layer 212 of the element main body 21 of the semiconductor element 20. At least any one of the plurality of electrodes 31 is electrically conductive to the switching circuit 212A. On the other hand, the back surface 102 of the plurality of first leads 11 which is included in the conductive member 10 and to which at least any one of the plurality of electrodes 31 is bonded is exposed on the bottom surface 42 of the sealing resin 40. As a result, when the semiconductor device A10 is used, the heat generated from the semiconductor element 20 by driving the switching circuit 212A can be efficiently dissipated to the outside.

Each of the plurality of first leads 11 has the main portion 111 extending in the first direction x and the pair of side portions 112 connected to both ends of the main portion 111 in the first direction x. Each of the pair of side portions 112 has the first end face 112A that faces in the first direction x and that is exposed on the first side surface 431 of the sealing resin 40. Each of the pair of first end faces 112A is flush with the first side surface 431. In the second direction y, each dimension b of the pair of first end faces 112A is smaller than the dimension B of the back surface 102 of the main portion 111. The area of each of the pair of first end faces 112A can thereby be made smaller than the area in the QFN semiconductor device of the existing technology. Therefore, in the manufacture of the semiconductor device A10, when individualization is performed by blade dicing, the generation of metal burrs on the pair of first end faces 112A is suppressed. When the generation of metal burrs is suppressed, the mountability of the semiconductor device A10 on the wiring board can be improved.

As illustrated in FIG. 9, the constricted portion 112B is formed in each of the pair of side portions 112 of the plurality of first leads 11 (the first input terminal 11A and the output terminal 11C). In the second direction y, each dimension b of the pair of first end faces 112A can thereby be made smaller than the dimension B of the back surface 102 of the main portion 111 of the first lead 11. Further, the constricted portion 112B is configured to be in contact with the sealing resin 40 in the first direction x. As a result, the plurality of first leads 11 can be prevented from coming out of the pair of first side surfaces 431 of the sealing resin 40.

As illustrated in FIG. 10, the cutout 112C is formed in each of the pair of side portions 112 of the first lead 11 (second input terminal 11B). Also by this, in the second direction y, each dimension b of the pair of first end faces 112A can be made smaller than the dimension B of the back surface 102 of the main portion 111 of the first lead 11. The cutout 112C is filled with the sealing resin 40. As a result, the first lead 11 is configured to be in contact with the sealing resin 40 in the first direction x. Therefore, the first lead 11 can be prevented from coming out of the pair of first side surfaces 431 of the sealing resin 40.

The second input terminal 11B includes the plurality of projections 113 protruding from the other side in the second direction y of the main portion 111. Each of the plurality of projections 113 has the sub-end face 113A facing in the second direction y. The plurality of sub-end faces 113A are exposed on the second side surface 432 of the sealing resin 40 located on the other side in the second direction y. As a result, the second input terminal 11B is in contact with the sealing resin 40 on the other side in the second direction y. Accordingly, the second input terminal 11B can be prevented from coming out of the second side surface 432 located on the other side in the second direction y.

In each of the plurality of first leads 11, the area of the main surface 101 is larger than the area of the back surface 102. Due to this, the plurality of first leads 11 are configured to be in contact with the sealing resin 40 through its surface facing the same side as the back surface 102 faces in the thickness direction z. Therefore, the plurality of first leads 11 can be prevented from coming out from the bottom surface 42 of the sealing resin 40. Further, a wider area of each main surface 101 of the plurality of first leads 11 to which at least any one of the plurality of electrodes 31 is bonded can be secured. The number of the plurality of electrodes 31 electrically bonded to the plurality of first leads 11 can thereby be further increased.

The conductive member 10 further includes the plurality of second leads 12 to which at least any one of the plurality of electrodes 31 is bonded. In each of the plurality of second leads 12, the area of the main surface 101 is larger than the area of the back surface 102. Therefore, similarly to the relation between the main surface 101 and the back surface 102 of the first lead 11 described above, the plurality of second leads 12 can be prevented from coming out of the bottom surface 42 of the sealing resin 40. Further, the area of each of the plurality of second leads 12 to which at least any one of the plurality of electrodes 31 is bonded can be further secured. Due to this, the number of the plurality of electrodes 31 electrically bonded to the plurality of second leads 12 can be further increased.

Second Embodiment

A semiconductor device A20 according to a second embodiment of the present disclosure will be described with reference to FIG. 21. In this figure, the same or similar elements of the semiconductor device A10 described above are designated by the same reference numerals, and redundant description will be omitted. Here, the cross-sectional position of FIG. 21 is the same as that of FIG. 15.

The structures of the plurality of electrodes 31 and the bonding layers 32 of the semiconductor device A20 are different from those of the semiconductor device A10 described above.

Figure 21:
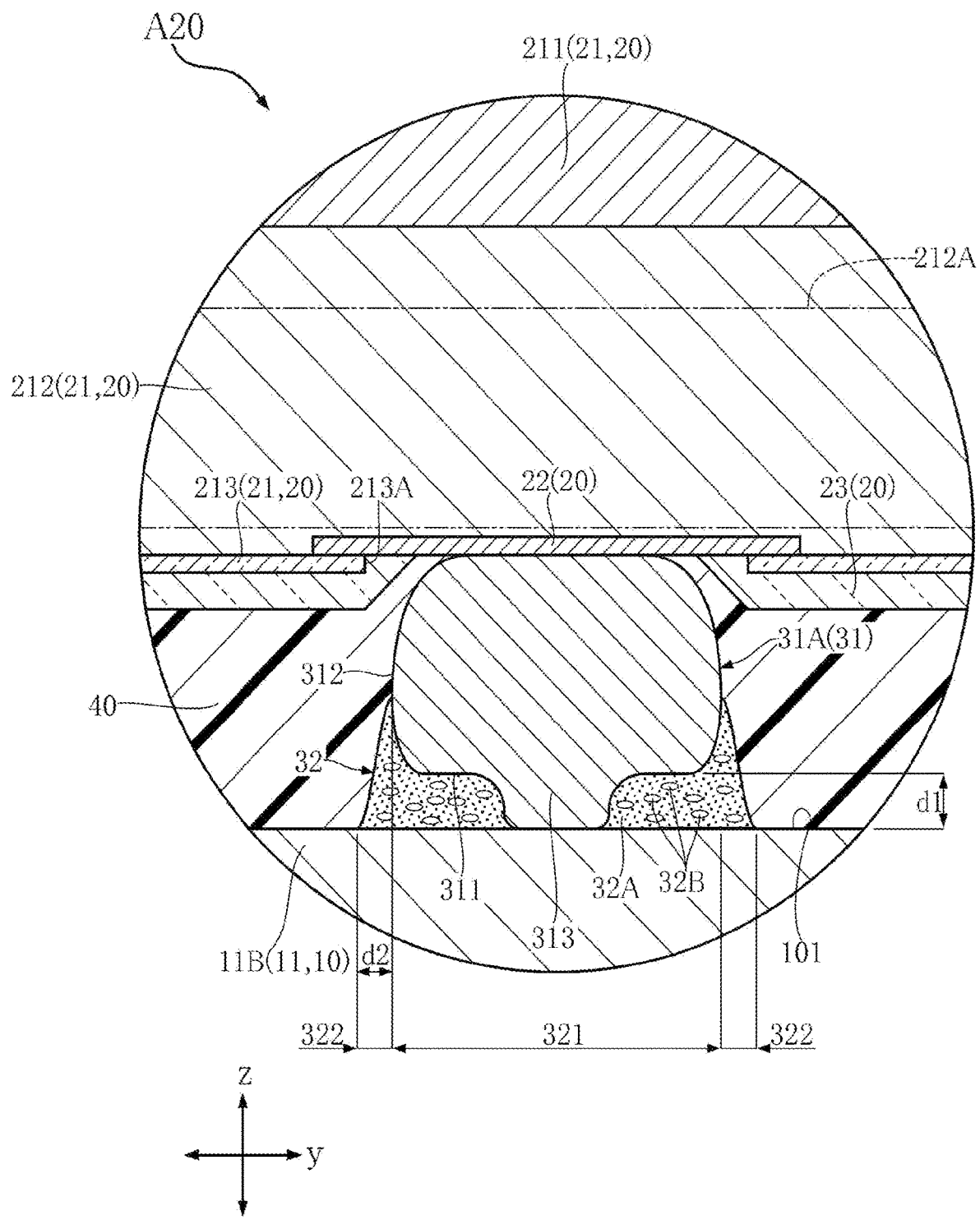
FIG. 21 is a partially enlarged cross-sectional view of a semiconductor device according to the second embodiment of the present disclosure.

As illustrated in FIG. 21, in the semiconductor device A20, at least any one of the plurality of electrodes 31 has a protrusion 313 projecting from the facing surface 311 toward the main surface 101 of the conductive member 10. An electrode 31 having the protrusion 313 formed by wire bonding is a stud bump. The protrusion 313 is in contact with the first portion 321 of the bonding layer 32. Further, in the semiconductor device A20, the protrusion 313 is also in contact with the main surface 101. The protrusion 313 is formed at the same time as the other portion of the electrode 31 by wire bonding.

As illustrated in FIG. 21, in the bonding layer 32 of the semiconductor device A20, a first dimension d1 is larger than a second dimension d2. The first dimension d1 is the dimension of the first portion 321 of the bonding layer 32, which extends from the facing surface 311 of any of the plurality of electrodes 31 to the main surface 101 of the conductive member 10. The second dimension d2 is the dimension of the second portion 322, which extends from the side surface 312 of any of the plurality of electrodes 31 to the peripheral edge of the second portion 322 of the bonding layer 32 when viewed in the thickness direction z.

Modification Example

Next, a semiconductor device A21, which is a modification example of the semiconductor device A20, will be described with reference to FIG. 22. Here, the cross-sectional position of FIG. 22 is the same as that of FIG. 21.

Figure 22:
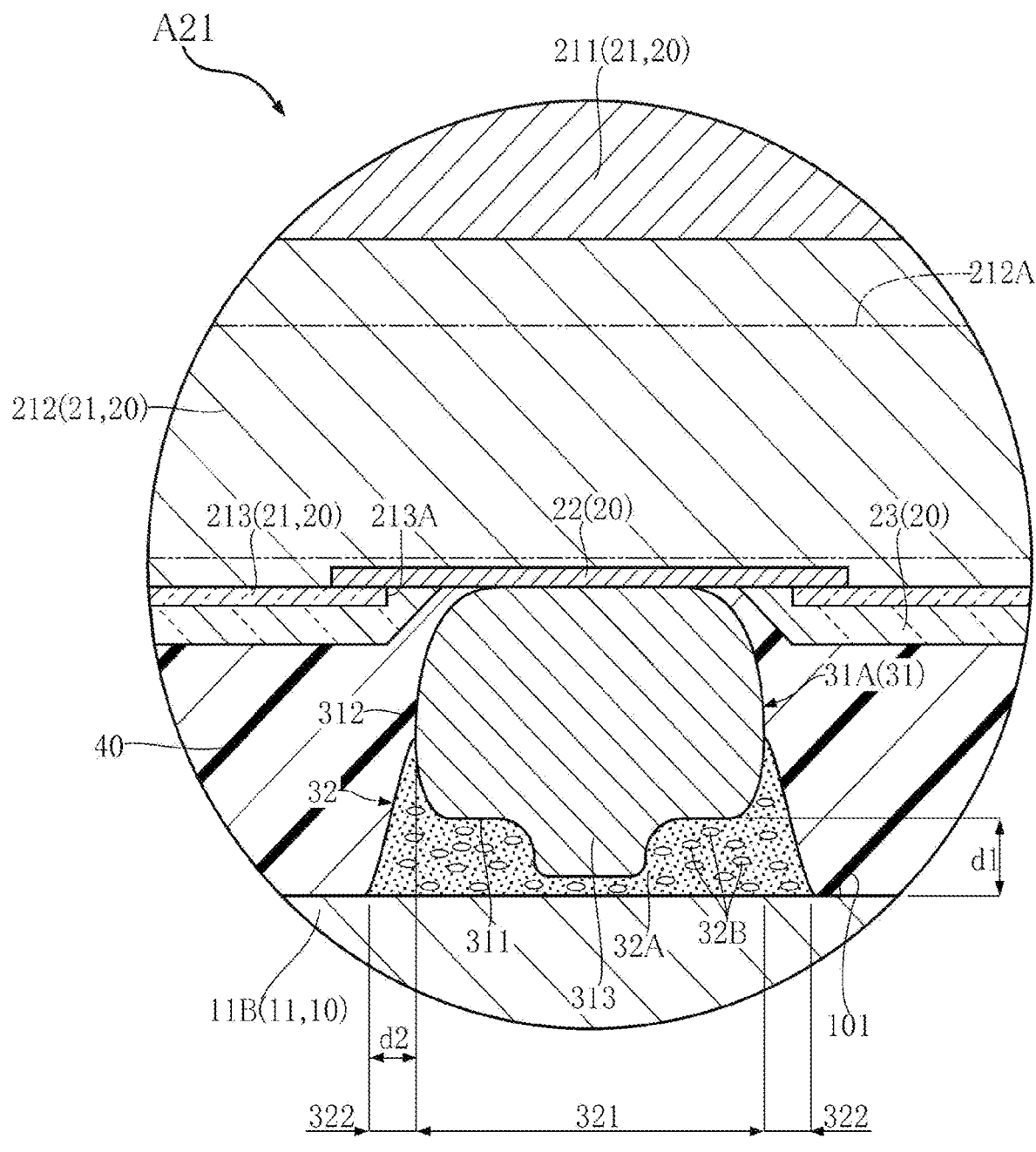
FIG. 22 is a partially enlarged cross-sectional view of a modification example of the semiconductor device illustrated in FIG. 21.

As illustrated in FIG. 22, in the semiconductor device A21, the protrusion 313 is separated from the main surface 101 of the conductive member 10 in at least any one of the plurality of electrodes 31.

Next, the function effect of the semiconductor device A20 will be described.

The semiconductor device A20 is provided with the plurality of electrodes 31 that are formed individually with respect to the plurality of pads 22 of the semiconductor element 20 and that protrude from the plurality of pads 22 toward the main surface 101 of the conductive member 10; and the bonding layer 32 for electrically bonding the main surface 101 to the plurality of electrodes 31. The bonding layer 32 includes the first region 32A having conductivity and the second region 32B having electrical insulation. The first electrode 31A is a combination of sintered metal particles. At least a part of the second region 32B is made of a material containing a synthetic resin. Therefore, the semiconductor device A20 can also suppress the occurrence of cracks on the bonding layer 32 while preventing short circuits of the plurality of electrodes 31.

In the semiconductor device A20, at least any one of the plurality of electrodes 31 has the protrusion 313 projecting from the facing surface 311 toward the main surface 101 of the conductive member 10. The protrusion 313 is in contact with the first portion 321 of the bonding layer 32. Due to this, the contact area of the electrode 31 with respect to the first portion 321 is expanded, so that the bonding strength of the electrode 31 with respect to the conductive member 10 is further increased. Further, the electrode 31 has an anchor effect on the first portion 321. This contributes to the increase in the bonding strength.

By at least any one of the plurality of electrodes 31 having the protrusion 313, the bonding layer 32 can have a configuration in which the first dimension d1 illustrated in FIG. 21 is larger than the second dimension d2 illustrated in FIG. 21. As a result, even in a case where the volume of the bonding layer 32 of the semiconductor device A20 is smaller than that of the bonding layer 32 of the semiconductor device A10, since the volume of the first portion 321 of the bonding layer 32 is prevented from becoming extremely small, the bonding strength of the electrode 31 with respect to the conductive member 10 can be made comparable to that of the semiconductor device A10. Further, the volume of the second portion 322 of the bonding layer 32 can be prevented from becoming extremely large. Since the thermal stress may be concentrated in the second portion 322 if the volume of the second portion 322 becomes extremely large, the concentration of the thermal stress can be prevented by this configuration.

In the semiconductor device A10 and the semiconductor device A20, the conductive member 10 is intended for the plurality of leads (the plurality of first leads 11, the plurality of second leads 12, and the pair of third leads 13) including the same lead frame. Other configurations of the conductive member 10 may include one including an insulating substrate and a conductive layer that is arranged on the insulating substrate and has a plurality of regions separated from each other.

The present disclosure is not limited to the embodiments described above. The specific configuration of each part of the present disclosure can be freely redesigned.

The technical configuration of the semiconductor device and the method for manufacturing the semiconductor device provided by an embodiment of the present disclosure will be supplementarily described below.

Supplementary Note 1

A semiconductor device including:

a conductive member that has a main surface facing in a thickness direction;

a semiconductor element that has a plurality of pads facing the main surface;

a plurality of electrodes that are individually formed with respect to the plurality of pads and protrude from the plurality of pads toward the main surface; and a bonding layer for electrically bonding the main surface to the plurality of electrodes, in which the bonding layer includes a first region having conductivity and a second region having electrical insulation, the first region includes a metal portion, and at least a part of the second region includes a resin portion.

Supplementary Note 2

The semiconductor device described in supplementary note 1, in which the metal portion is a sintered body.

Supplementary Note 3

The semiconductor device described in supplementary note 1 or 2, in which the second region includes a vacancy.

Supplementary Note 4

The semiconductor device described in any one of supplementary notes 1 to 3, in which a volume of the second region is 15% to 35%, both inclusive, of a total volume of the bonding layer.

Supplementary Note 5

The semiconductor device described in any one of supplementary notes 1 to 4, in which each of the plurality of electrodes has a facing surface that faces the main surface and a side surface that is connected to the facing surface and faces in a direction perpendicular to the thickness direction, and the bonding layer is in contact with the main surface and the facing surface.

Supplementary Note 6

The semiconductor device described in supplementary note 5, in which the bonding layer has a first portion located between the main surface and the facing surface of any of the plurality of electrodes, and a second portion that is connected to the first portion and protrudes outward from the side surface of any of the plurality of electrodes when viewed in the thickness direction, and the second portion is in contact with the side surface of any of the plurality of electrodes.

Supplementary Note 7

The semiconductor device described in supplementary note 6, in which a cross-sectional area of the second portion in a direction perpendicular to the thickness direction is gradually smaller toward the semiconductor element from the facing surface.

Supplementary Note 8

The semiconductor device described in any one of supplementary notes 5 to 7, in which at least the side surface of any one of the plurality of electrodes bulges out in a direction perpendicular to the thickness direction.

Supplementary Note 9

The semiconductor device described in any one of supplementary notes 6 to 8, in which at least any one of the plurality of electrodes has a protrusion that projects from the facing surface toward the main surface, and the protrusion is in contact with the first portion.

Supplementary Note 10

The semiconductor device described in supplementary note 9, in which the protrusion is separated from the main surface.

Supplementary Note 11

The semiconductor device described in supplementary notes 9 or 10, in which, in the bonding layer, a first dimension from the facing surface of any of the plurality of electrodes to the main surface is larger than a second dimension from the side surface of any of the plurality of electrodes to a periphery of the second portion when viewed in the thickness direction.

Supplementary Note 12

The semiconductor device described in any one of supplementary notes 1 to 11, in which a composition of the metal portion contains silver.

Supplementary Note 13

The semiconductor device described in any one of supplementary notes 1 to 12, in which a composition of each of the plurality of electrodes includes at least either gold or silver.

Supplementary Note 14

The semiconductor device described in any one of supplementary notes 1 to 12,
in which each of the plurality of electrodes includes a main portion formed on each of the plurality of pads and a sub-portion formed so as to cover the main portion,
a composition of the main portion contains copper, and
a composition of the sub-portion contains palladium.

Supplementary Note 15

The semiconductor device described in any one of supplementary notes 1 to 14, further including:
a sealing resin that is in contact with the main surface and covers the semiconductor element and the plurality of electrodes.

Supplementary Note 16

A method for manufacturing a semiconductor device, the method including:
a step of individually forming a plurality of electrodes with respect to a plurality of pads, on a semiconductor element that has the plurality of pads provided on one side in a thickness direction;
a step of applying a bonding material to the plurality of electrodes; and
a step of electrically bonding the plurality of electrodes to a main surface of a conductive member that has the main surface facing in the thickness direction such that the plurality of electrodes face the main surface,
in which the bonding material is made of a material containing a metal particle and a resin, and,
in the step of bonding the plurality of electrodes to the main surface, the plurality of electrodes are electrically bonded to the main surface by firing the bonding material under atmospheric pressure after the bonding material is brought into contact with the main surface.

Supplementary Note 17

The method for manufacturing a semiconductor device described in supplementary note 16, in which, in the step of forming the plurality of electrodes, the plurality of electrodes are individually formed with respect to the plurality of pads by wire bonding.

What is claimed is:

1. A semiconductor device comprising:
a conductive member that has a main surface facing in a thickness direction;
a semiconductor element that has a plurality of pads facing the main surface;
a plurality of electrodes that are individually formed with respect to the plurality of pads and protrude from the plurality of pads toward the main surface; and
a bonding layer for electrically bonding the main surface to the plurality of electrodes,
wherein the bonding layer includes a first region having conductivity and a second region having electrical insulation,
the first region includes a metal portion, and
at least a part of the second region includes a resin portion.

2. The semiconductor device according to claim 1, wherein the metal portion is a sintered body.

3. The semiconductor device according to claim 1, wherein the second region includes a vacancy.

4. The semiconductor device according to claim 1, wherein a volume of the second region is 15% to 35%, both inclusive, of a total volume of the bonding layer.

5. The semiconductor device according to claim 1,
wherein each of the plurality of electrodes has a facing surface that faces the main surface and a side surface that is connected to the facing surface and faces in a direction perpendicular to the thickness direction, and
the bonding layer is in contact with the main surface and the facing surface.

6. The semiconductor device according to claim 5,
wherein the bonding layer has a first portion located between the main surface and the facing surface of any of the plurality of electrodes, and a second portion that is connected to the first portion and protrudes outward from the side surface of any of the plurality of electrodes when viewed in the thickness direction, and
the second portion is in contact with the side surface of any of the plurality of electrodes.

7. The semiconductor device according to claim 6, wherein a cross-sectional area of the second portion in a direction perpendicular to the thickness direction is gradually smaller toward the semiconductor element from the facing surface.

8. The semiconductor device according to claim 6,
wherein at least any one of the plurality of electrodes has a protrusion that projects from the facing surface toward the main surface, and
the protrusion is in contact with the first portion.

9. The semiconductor device according to claim 8, wherein the protrusion is separated from the main surface.

10. The semiconductor device according to claim 8, wherein, in the bonding layer, a first dimension from the facing surface of any of the plurality of electrodes to the main surface is larger than a second dimension from the side surface of any of the plurality of electrodes to a periphery of the second portion when viewed in the thickness direction.

11. The semiconductor device according to claim 5, wherein at least the side surface of any one of the plurality of electrodes bulges out in a direction perpendicular to the thickness direction.

12. The semiconductor device according to claim 1, wherein a composition of the metal portion contains silver.

13. The semiconductor device according to claim 1, wherein a composition of each of the plurality of electrodes includes at least either gold or silver.

14. The semiconductor device according to claim 1,
   wherein each of the plurality of electrodes includes a main portion formed on each of the plurality of pads and a sub-portion formed so as to cover the main portion,
   a composition of the main portion contains copper, and
   a composition of the sub-portion contains palladium.

15. The semiconductor device according to claim 1, further comprising:
   a sealing resin that is in contact with the main surface and covers the semiconductor element and the plurality of electrodes.

* * * * *